US012772837B2

(12) United States Patent
Then et al.

(10) Patent No.: US 12,772,837 B2
(45) Date of Patent: Oct. 20, 2026

(54) INTEGRATED CIRCUIT STRUCTURES HAVING BACKSIDE HIGH VOLTAGE CAPACITORS FOR FRONT SIDE GaN-BASED DEVICES

(71) Applicant: Intel Corporation, Santa Clara, CA (US)

(72) Inventors: Han Wui Then, Portland, OR (US); Marko Radosavljevic, Portland, OR (US); Samuel James Bader, Hillsboro, OR (US); Ahmad Zubair, Hillsboro, OR (US); Pratik Koirala, Portland, OR (US); Michael S. Beumer, Portland, OR (US); Heli Chetanbhai Vora, Hillsboro, OR (US); Ibrahim Ban, Beaverton, OR (US); Nityan Nair, Portland, OR (US); Thomas Hoff, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 73 days.

(21) Appl. No.: 18/088,541

(22) Filed: Dec. 24, 2022

(65) Prior Publication Data

US 2024/0213140 A1 Jun. 27, 2024

(51) Int. Cl.
*H10W 20/40* (2026.01)
*H10W 20/20* (2026.01)
*H10W 20/42* (2026.01)

(52) U.S. Cl.
CPC ......... *H10W 20/496* (2026.01); *H10W 20/20* (2026.01); *H10W 20/42* (2026.01)

(58) Field of Classification Search
None
See application file for complete search history.

(56) References Cited

U.S. PATENT DOCUMENTS

| | | | | |
|---|---|---|---|---|
| 2022/0102339 | A1* | 3/2022 | Then | H10D 30/015 |
| 2023/0422485 | A1* | 12/2023 | Sharma | H10D 62/121 |

* cited by examiner

*Primary Examiner* — Anthony Ho
(74) *Attorney, Agent, or Firm* — Schwabe, Williamson & Wyatt, P.C.

(57) ABSTRACT

Structures having backside high voltage capacitors for front side GaN-based devices are described. In an example, an integrated circuit structure includes a front side structure including a GaN-based device layer, and one or more metallization layers above the GaN-based device layer. A backside structure is below and coupled to the GaN-based layer, the backside structure including metal layers and one or more alternating laterally-recessed metal insulator metal capacitors.

20 Claims, 14 Drawing Sheets

INTEGRATED CIRCUIT STRUCTURES HAVING BACKSIDE HIGH VOLTAGE CAPACITORS FOR FRONT SIDE GaN-BASED DEVICES

TECHNICAL FIELD

Embodiments of the disclosure are in the field of integrated circuit structures and processing and, in particular, integrated circuit structures having backside high voltage capacitors for front side GaN-based devices, and methods of fabricating integrated circuit structures having backside high voltage capacitors for front side GaN-based devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nano-wires used to fabricate devices provide improved short channel control.

Scaling multi-gate and nano-wire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

Another aspect driving innovation is the drive for high bandwidth (HBW) computing.

In another aspect, power delivery and RF communication are essential to every compute solution. Si and III-V technologies are facing fundamental limits in power and RF. Future compute solutions will require a better semiconductor technology to continue to deliver better energy efficiencies, better performance, and more functionalities in smaller form factors. Two industry trends are converging to transform power delivery and RF: 300 mm gallium nitride (GaN)-on-Si and monolithic 3D ICs. Amongst semiconductor technologies today, GaN is best for power delivery and RF due to its wide bandgap qualities.

DESCRIPTION OF THE EMBODIMENTS

Figure 1A:
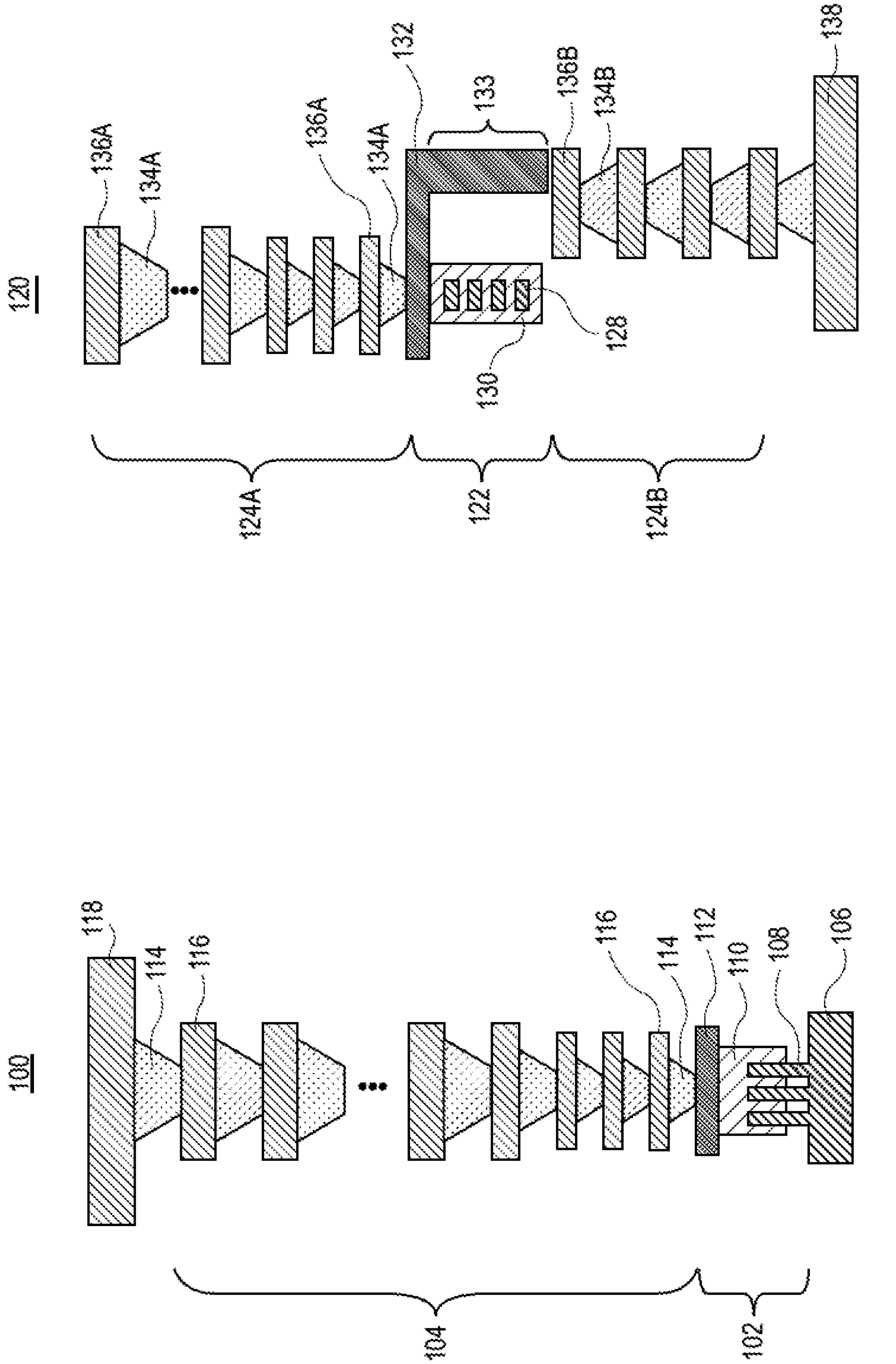
FIG. 1A illustrates cross-sectional views of an interconnect stack having front side power delivery and of an interconnect stack having backside power delivery, in accordance with an embodiment of the present disclosure.

Integrated circuit structures having backside high voltage capacitors for front side GaN-based devices, and methods of fabricating integrated circuit structures having backside high voltage capacitors for front side GaN-based devices, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to GaN processes with integrated high density high voltage metal insulator metal (MIM) capacitors. One or more embodiments described herein are directed to integrated circuit structures having backside capacitors coupled to front side GaN-based devices. One or more embodiments described herein are directed to integrated circuit structures having front side GaN-based devices together with front side silicon fin-based devices. One or more embodiments described herein are directed to integrated circuit structures having front side GaN-based devices together with front side silicon nano-wire-based devices. It is to be appreciated that, unless indicated otherwise, reference to nano-wires herein can indicate nano-wires or nano-ribbons or even nano-sheets.

To provide context, it is an industry challenge to improve the power density of power electronics solutions without compromising on power efficiency. Therefore, industry is looking to deploy GaN transistors that are uniquely capable of higher voltage, high current density and high efficiency to deliver power to CPUs and GPUs. While GaN transistors are inherently capable of high voltages, the required passive component technologies such as capacitors and inductors, need to catch up. High density high voltage capacitors, e.g., greater than 5V, are found in board-mounted ceramic caps, but not found on-die. High density on-die capacitors, for e.g. MIMs (Metal-Insulator-Metal capacitors), are of low voltages, limited to ~2V. Today, high density on-die capacitors that are capable of high voltages >5V do not exist. Embodiments described herein can be implemented to provide high density high voltage on-die MIM to integrate with high voltage and efficiency GaN transistors.

Previous approaches have included the use of high density high voltage ceramic caps on board. However, high density high voltage ceramic caps are found on board. It requires circuit designers to dedicate additional space on the board near the IC package, hence negating the goal of achieving a small form-factor or a high density solution. Moreover, parasitic inductance in the route between the board and the IC package can cause a reduction in the effective capacitance seen by the power ICs that are on the die. This again works against the goal of achieving a high-density solution.

In accordance with one or more embodiments of the present disclosure, the backside area of a GaN die is utilized to populate it with high voltage MIM solution. To achieve high capacitance density, embodiments can include stacking layers of the high voltage MIM, using through silicon vias (TSVs) to connect with the GaN power ICs fabricated on the front side. Embodiments described herein can be implemented to build and offer differentiating products with efficiency and dense power delivery.

To provide further context, in standard cell design, the diffusion placement and metal routing layers are designed around a power delivery scheme. It can be through front side bump to the MO and the diffusion contact or in the newer architectures it can be through wafer backside metals would be tapped through a via that would contact the diffusion contact on the front side. When these are performed, either on the front side metals or the diffusion there is a space allocation for the delivery of power.

Traditionally, power is delivered from a front side interconnect. At standard cell level, power can be delivered right on top of transistors or from a top and bottom cell boundary. Power delivered from a top and bottom cell boundary enables relatively shorter standard cell height with slightly higher power network resistance. However, a front side power network shares interconnect stack with signal routing and reduces signal routing tracks. In addition, for high performance design, top and bottom cell boundary power metal wires must be wide enough to reduce power network resistance and improve performance. This normally results in a cell height increase. In accordance with one or more embodiments of the present disclosure, delivering power from a wafer or substrate backside can be implemented to solve area and performance problems. At the cell level, wider metal 0 power at the top and bottom cell boundary may no longer be needed and, hence, cell height can be reduced. In addition, power network resistance can be significantly reduced resulting in performance improvement. At block and chip level, front side signal routing tracks are increased due to removed power routing and power network resistance is significantly reduced due to very wide wires, large vias and reduced interconnect layers.

In earlier technologies, a power delivery network from bump to the transistor required significant block resources. Such resource usage on the metal stack expressed itself in some process nodes as Standard Cell architectures with layout versioning or cell placement restrictions in the block level. In an embodiment, eliminating the power delivery network from the front side metal stack allows free sliding cell placement in the block without power delivery complications and placement related delay timing variation.

As a comparison, FIG. 1A illustrates cross-sectional views of an interconnect stack having front side power delivery and of an interconnect stack having backside power delivery, in accordance with an embodiment of the present disclosure.

Referring to FIG. 1A, an interconnect stack 100 having front side power delivery includes a transistor 102 and signal and power delivery metallization 104. The transistor 102 includes a bulk substrate 106, semiconductor fins 108, a terminal 110, and a device contact 112. The signal and power delivery metallization 104 includes conductive vias 114, conductive lines 116, and a metal bump 118.

Referring again to FIG. 1A, an interconnect stack 120 having backside power delivery includes a transistor 122, front side signal metallization 124A, and power delivery metallization 124B. The transistor 122 includes semiconductor nano-wires or nano-ribbons 128, a terminal 130, and a device contact 132, and a boundary deep via 133. The front side signal metallization 124A includes conductive vias 134A and conductive lines 136A. The power delivery metallization 124B includes conductive vias 134B, conductive lines 136B, and a metal bump 138.

To provide further context, one of the ultimate goals in Standard Cell design is to minimize the impact of the power delivery to the signal routing in terms of area, while maintaining a robust power delivery scheme which would have minimum voltage drop from the supply. With front side power delivery, commercialized Standard Cell architectures had to allocate routing tracks for power and ground from the top of the front side stack to the first metal routing layer, MO. This approach would exploit metal routing tracks. That means tighter metal pitches are required to deliver power while routing signals. Tighter metal pitches cause higher cap and resistance resulting in higher power consumption. Furthermore, due to the resistance greater voltage drop occurs from the top of the stack to the transistor source.

In another aspect, a GaN process with integrated high density high voltage MIM is described.

In accordance with one or more embodiments of the present disclosure, the chip real-estate on the backside of a GaN or GaN/Si wafer is processed into integrated metal insulator metal (MIM) capacitors. In an embodiment, high-density and high-voltage MIM is integrated on the backside of wafer. In specific such embodiments, the high-density and high-voltage MIM is connected to the front side FEOL (GaN or GaN and CMOS) by through silicon vias (TSVs). In the case that the FEOL has GaN and CMOS, in a specific embodiment, the CMOS has silicon fin-based transistors or silicon nano-wire-based transistors.

In accordance with one or more embodiments of the present disclosure, a fabrication process involves first fabricating GaN transistors and, possibly, heterogeneously integrated Si CMOS and ICs on the front side of wafer. The front side of the wafer is then protected and the wafer is flipped to expose the backside. The wafer is bonded to a carrier wafer. The silicon substrate is thinned to approximately or less than 100 microns. TSVs are fabricated to allow electrical connections between the backside and the front side of the wafer. High voltage multi-layer stacked MIM is then fabricated on the backside. Backside bumps are then formed.

Figure 1B:
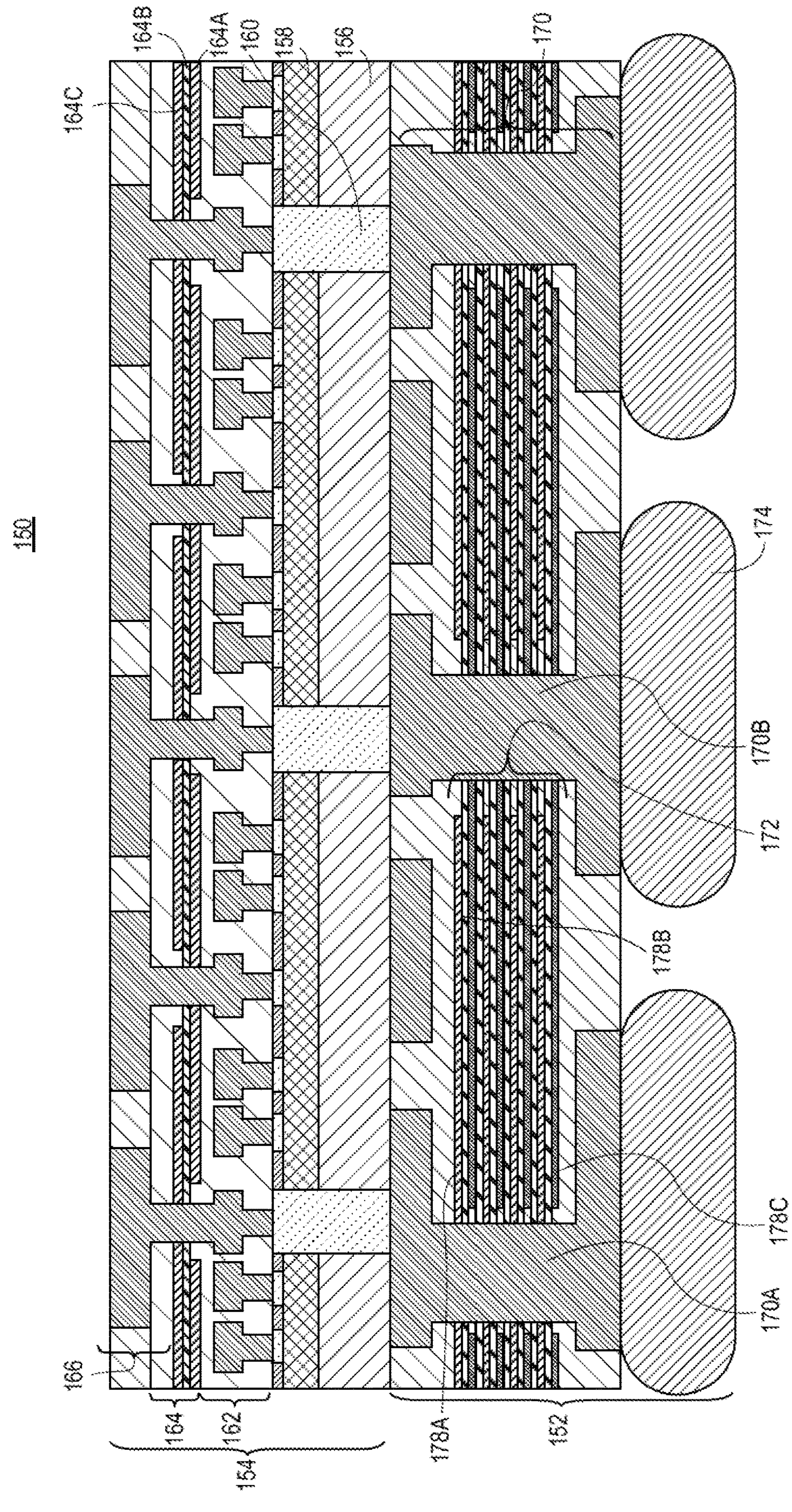
FIG. 1B illustrates a cross-sectional view of an integrated circuit structure having front side GaN-based devices and backside MIM capacitors, in accordance with an embodiment of the present disclosure.

As an exemplary structure, FIG. 1B illustrates a cross-sectional view of an integrated circuit structure having front side GaN-based devices and backside MIM capacitors, in accordance with an embodiment of the present disclosure. It is to be appreciated that the referenced MOS (such as CMOS) transistors can be planar transistors, or non-planar-based transistors, such as transistors based on fins (silicon fin-based transistors), or nano-wires or nano-ribbons or nano-sheets, which may be referred to generally as silicon nano-wire-based transistors.

Referring to FIG. 1B, an integrated circuit structure 150 includes a front side structure 154 on a backside structure 152. The front side structure 154 includes a device layer 158, a plurality of metallization layers 162 and 166 and, possibly, a front side MIM capacitor layer 164 (e.g., with electrode layers 164A and 164C, and capacitor dielectric layer 164B). The backside structure 152 includes a stack of backside conductive structures 170 that terminate at conductive bumps 174.

In an embodiment, the device layer 158 includes GaN-based devices. In an embodiment, the device layer 158 includes GaN-based devices and MOS based devices, such as silicon-based Field Effect Transistors (FETs), e.g., planar FETs or non-planar-based FETs such as nano-wire-based or fin-based transistors. In an embodiment, the device layer 158 is on a silicon substrate 156, such as a Si(111) substrate. In an embodiment, the device layer 158 is coupled to the backside structure 152 by through silicon vias 160, as is depicted.

In an embodiment, the backside structure 152 includes multi-layer planar metal-insulator-metal (MIM) capacitors 172, as is depicted. In one embodiment, the multi-layer MIM capacitors 172 include multiple layers 178A of a first electrode material type, multiple layers 178C of a second electrode material type, and multiple layers 178B of intervening capacitor dielectric material, such as a high-k dielectric material. In an embodiment, the backside conductive structures 170 include a first contact electrode type 170A that contacts the multiple layers 178A of the first electrode material type, and a second contact electrode type 170B that contacts the multiple layers 178C of the second electrode material type. In an embodiment, each of the MIM capacitors 172 is referred to as an alternating laterally-recessed alternating metal insulator metal capacitor in that the laterally recessed electrodes 1 (178As) and electrodes 2 (178Bs) alternate with one another with respect to the lateral side subjected to lateral recess.

In other embodiments, hybrid bonding is used to fabricate structures such as those described herein. In one such embodiment, a fabrication technique, the GaN IC or GaN plus CMOS IC) is fabricated on a separate wafer, and the high-voltage MIM is fabricated on a separate wafer. In both cases, fabrication is performed on the front side of each wafer. Subsequently, both wafers are flipped, each bonded to a carrier wafer and each silicon substrate thinned. TSVs are then fabricated on both wafers. The carrier wafer with the high-voltage MIM is then flipped and hybrid bonded to the carrier wafer with the GaN ICs. At this point, the top-side carrier wafer (with the high-voltage MIM) is then grinded away to expose the metals. Backside bumps may then be fabricated.

In accordance with one or more embodiments of the present disclosure, with respect to high voltage MIM fabrication, a multi-layer MIM is fabricated using less than four masks. As a comparison, state-of-the-art stacked MIMs are fabricated using at least the same number of masks as the number of layers of MIMs. For example, stacking 10 layers of MIMs (~10× higher MIM density) typically requires at least 10 masks. The cost scales with the number of masks. Consequently, stacking many layers of MIMs can become an untenably cost prohibitive.

By contrast, in accordance with an embodiment of the present disclosure, any number of layers of MIM are fabricated using less than four masks. In an exemplary approach, two types of metal electrodes are used for the MIMs. The composition of the metals allows one to be etched selective to another. In one embodiment, the pair choices are Cr and TiN, or W and TiN, etc., with the appreciation that many such combinations are possible.

In an embodiment, with reference again to FIG. 1B, the laterally recessed electrode 1 (178As) and electrode 2 (178Bs) are in two types of contact trenches through the MIM stack. In the first type of contact trench (ultimately filled with contact type 170A), electrode 2 is laterally recessed with respect to electrode 1 prior to electrode conductive fill. Whereas, in the second type of contact trench (ultimately filled with contact type 170B), electrode 1 is laterally recessed prior to electrode conductive fill. The recessed regions are subsequently filled with non-conductive dielectric prior to electrode conductive fill. In this way, when the trenches are filled with interconnect metal (e.g., Cu) to form contact types 170A and 170B, the contact trench type 170A contacts the electrode 1, while the contact trench type 170B contacts the electrode 2. In one embodiment, with a fixed number of masks (less than 4) needed to fabricate N layers of MIMs, the cost of the MIM can scale (cheaper by ~1/N) with the addition of additional layers of MIMs to increase its capacitive density.

To provide further context, RF power amplifiers (RF PAs) are needed to transmit RF signals between mobile devices and base stations located at far distances away, such as greater than 1 mile. The efficiency of these RF PAs is a key determinant of battery life in mobile handsets and power consumption (cost) in RF base stations. Good linearity of the RF power amplifier is required for modern communication standards such as 4G LTE and 5G standards. RF PAs typically operate at several dB back-off from its saturated mode in order to meet the linearity requirements. Thus, the efficiency suffers and in most PAs, it may degrade by a factor of 2-3×.

Due to its wide bandgap and high critical breakdown electric field, gallium nitride (GaN) transistors are considered for high voltage applications such as power converters, RF power amplifiers, RF switch and high voltage applications. Simple transistor architecture, namely, having a single gate, source and drain, falls short of realizing the full potential of GaN in achieving the maximum breakdown voltage as dictated by its material properties. This is because the drain electric field concentrates at the edge of the gate and causes premature breakdown.

It is to be appreciated that the above general structure including a GaN device layer above a silicon substrate, with TSVs there through, can be a suitable foundation for a variety of GaN based devices. Described below is a GaN based device that may be included, e.g., in the GaN device layer described in association with FIG. 1B.

Embodiments of the present disclosure relate to gallium nitride (GaN) transistors having source field plates. In embodiments, the transistors of the present disclosure have a gallium nitride (GaN) layer disposed above a substrate. A gate structure is disposed above the GaN layer. A source region and a drain region are disposed on opposite sides of the gate structure. The source field plate may be biased to an electrical potential which is the same as the source. The transistors of the present disclosure may enable new circuit architectures, such as a cross-coupled pairs. Additionally, the distance the source field plate extends above the drain can be independently adjusted to improve the effect the source field plate has on the field distribution, and hence increase breakdown voltage and linearity. In an embodiment, the transistor is operated in an enhancement mode. In an embodiment the gate structure may have a "T" shape in order to reduce the electrical resistance of the gate structure. In an embodiment, the transistor may include a second gate structure or multiple gate structures disposed between the gate structure and the source field plate to provide a multi-gate switch for, for example, an RF voltage divider.

Figure 2:
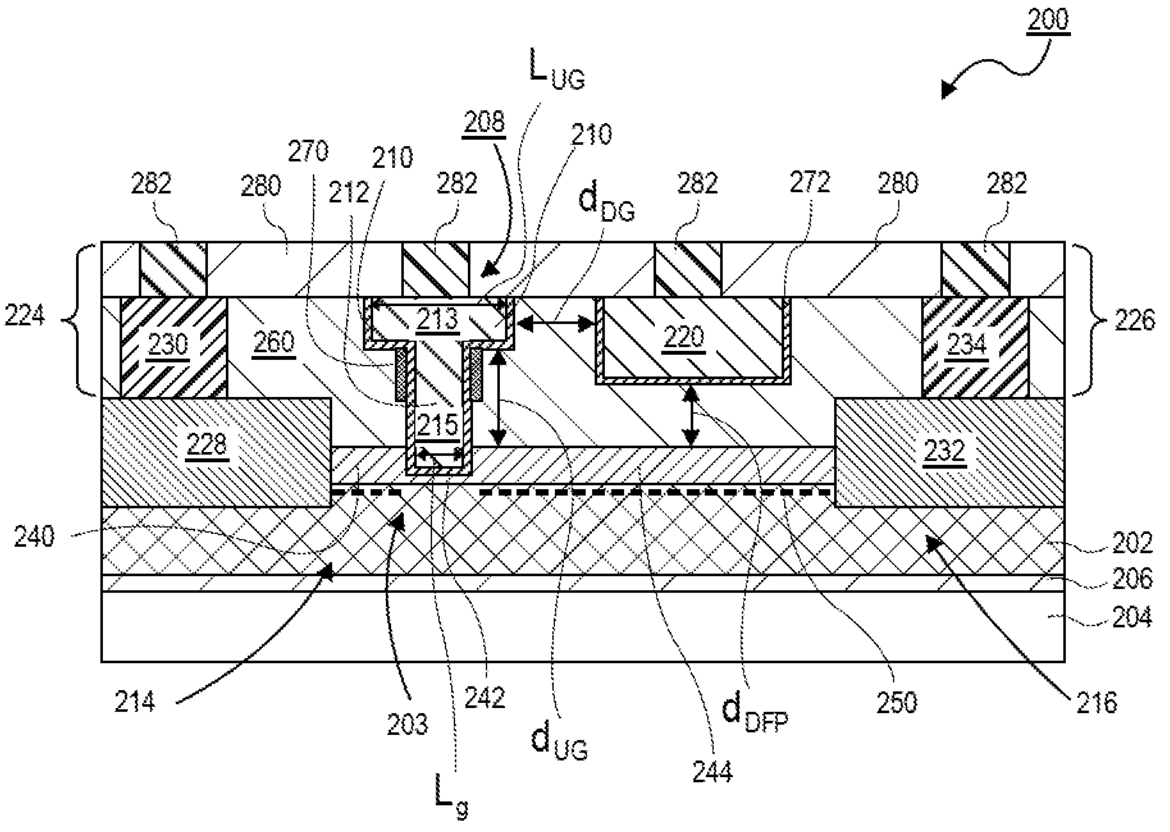
FIG. 2 illustrates a cross-sectional view of a transistor having a source field plate, in accordance with embodiments of the present disclosure.

FIG. 2 illustrates as transistor 200 having a source field plate in accordance with embodiments of the present disclosure. Transistor 200 includes a GaN layer 202 disposed above a substrate 204. A buffer layer 206 may be disposed between GaN layer 202 and substrate 204. A gate structure 208 is disposed above GaN layer 202 as illustrated in FIG. 2. Gate structure 208 may include a gate dielectric 210, such as a high-k gate dielectric, such as but not limited to hafnium oxide (e.g., $HfO_2$) and aluminum oxide (e.g., $Al_2O_3$), and a gate electrode 212, such as a metal gate electrode. A source region 214 and a drain region 216 are disposed on opposite sides of gate structure 208 as illustrated in FIG. 2.

Transistor 200 includes a source field plate 220 located above drain region 216. Source field plate 220 is separated from drain region 216 by a distance ($d_{DFP}$) as illustrated in FIG. 2. Source field plate 220 may be separated from gate structure 208 by a distance $d_{DG}$.

In an embodiment, source region 214 includes a source contact 224 and drain region 216 includes a drain contact 226. Source contact 224 may include a source semiconductor contact 228 and a source metal contact 230, and drain contact 226 may include a drain semiconductor contact 232 and a drain metal contact 234. In an embodiment as illustrated in FIG. 2, source semiconductor contact 228 and drain semiconductor contact 232 are formed from a group III-N semiconductor, such as but not limited to indium gallium nitride (InGaN). In an embodiment, the group III-N semiconductor has an N+ conductivity, such as, for example, containing Si dopant density greater than $1\times10^{18}$ atoms/$cm^3$. In an embodiment, the source metal contact 230 and the drain metal contact 234 include a metal, such as but not limited to titanium. In an embodiment, source field plate 220 is located laterally between drain metal contact 234 and gate structure 208 as shown in FIG. 2.

Transistor 200 may include a polarization layer 240 disposed on GaN layer 202. Polarization layer 240 may be formed from a group III-N semiconductor, such as but not limited to aluminum gallium nitride (AlGaN), aluminum indium nitride (AlInN), aluminum indium gallium nitride (AlInGaN) and indium gallium nitride (InGaN). In an embodiment, polarization layer 240 is sufficiently thick in order to create a two-dimensional electron gas (2DEG) effect or layer 250 in the top surface of GaN layer 202 as illustrated in FIG. 2. In an embodiment, polarization layer 240 has a portion 242 beneath gate structure 208 which is thinner than portion 244 above source region 214 and drain region 216 so that a 2DEG layer or effect is not created in gallium nitride layer 202 beneath gate structure 208 as shown in FIG. 2. In an embodiment, polarization layer 240 is completely removed from under gate structure 208 and gate structure 208 is disposed directly on GaN layer 202. In an embodiment polarization layer 240 is multi-layer film including a lower AlN film and an upper AlInN for example. In an embodiment, transistor 200 is operated in an enhancement mode.

Source field plate 220 and gate structure 208 are disposed within dielectric layer 260 as illustrated in FIG. 2. In an embodiment, the top surface of source field plate 220, is coplanar with the top surface of gate structure 208 as illustrated in FIG. 2. In an embodiment, the top surface of dielectric layer 260 is coplanar with the top surface of gate structure 208, and source field plate 220 as illustrated in FIG. 2. In an embodiment, the top surface of source metal contact 230 and the top surface of drain metal contact 234 are coplanar with the top surface of gate structure 208 and the top surface of source field plate 220.

Transistor 200 has a gate length ($L_g$) in a first direction extending between the source region 214 and the drain region 216 as shown in FIG. 2. A channel region 203 is located in GaN layer 202 beneath gate structure 208 and between source region 214 and drain region 216. Transistor 200 has a gate width (Gw) in a direction perpendicular (in and out of the page) to the gate length ($L_g$) direction. In an embodiment, transistor 200 has a gate width (Gw) between 0.010 microns-100 microns. In an embodiment, source field plate 220 extends the entire gate width (Gw) of transistor 200. In an embodiment, gate structure 208 has a "T" shape as illustrated in FIG. 2. Gate structure 208 may include an upper gate portion 213 and a lower gate portion 215. Upper gate portion 213 is distal from GaN layer 202 while lower gate portion 215 is nearer GaN layer 202. In an embodiment, lower gate portion 215 has a length ($L_g$) in the gate length direction which defines the gate length ($L_g$) of transistor 200. In an embodiment, upper gate portion 213 has length ($L_{ug}$) in the gate length direction which is at least two times, and in other embodiments at least three times, greater than the gate length ($L_g$) of lower gate portion 215. In an embodiment, as shown in FIG. 2 upper gate portion 213 extends a distance ($d_{UG}$) above drain region 216 which is greater than the distance $d_{DFP}$ that source field plate 220 extends above drain region 216. A recessed source field plate may provide improved control of the source field. In an embodiment, a recessed source field plate may exert a depletion effect on the 2DEG in the extended drain region. In an embodiment, upper gate portion 213 extends a distance ($d_{UG}$) above drain region 216 which is the same distance $d_{DFP}$ that source field plate 220 extends above drain region 216. In an embodiment, gate dielectric 210 is disposed along the sidewalls and bottom of upper gate portion 213 and along the sidewalls and bottom of lower gate portion 215 as illustrated in FIG. 2.

In an embodiment, source field plate 220 may be biased separately from a gate voltage (Vg) applied to gate structure 208. In an embodiment, source field plate 220 may be biased to a potential different than $V_{SS}$ or ground. In an embodiment, source field plate 220 may be biased differently than the voltage applied to source region 214. In an embodiment, source field plate 220 may be biased differently than a voltage applied to drain region 216. In an embodiment, source field plate 220 is not electrically connected to drain region 216.

In an embodiment, a pair of insulative spacers 270 are disposed along opposite sides of gate structure 208 as illustrated in FIG. 2. In an embodiment, insulative spacers 270 do not extend the entire height of gate structure 208. In an embodiment, insulative spacers 270 do not contact polarization layer 240 or GaN layer 202. In an embodiment, spacers 270 are formed beneath upper gate portion 213 and on sidewalls of lower gate portion 215 as illustrated in FIG. 2. In an embodiment, insulative spacers 270 are formed from an insulative material, such as but not limited to, silicon nitride and silicon oxynitride, which is different from the dielectric material of dielectric layer 260.

In an embodiment, a second dielectric layer 280 is disposed over dielectric layer 260. A plurality of conductive vias 282 may be disposed in dielectric 280 to enable independent electrical connections to and control of source region 214, drain region 216, source field plate 220 and gate structure 208.

In an embodiment, a high-k dielectric 272, such as but not limited to hafnium oxide (e.g., $HfO_2$) and aluminum oxide (e.g., $Al_2O_3$) may be disposed and on the sidewalls and bottom surface of source field plate 220 as illustrated in FIG. 2. In an embodiment, high-k dielectric 272 is the same high-k dielectric material as gate dielectric layer 210 of gate structure 208. In another embodiment, a high-k dielectric 272 is not included.

It is to be appreciated that the integrated circuit structures described above in association with FIG. 1B can be co-integrated with backside revealed silicon-based integrated circuit structures. Additionally or alternatively, other integrated circuit structures can be fabricated using processes described in association with FIG. 1B. As an example of a backside revealed silicon-based device, FIG. 3 illustrate a cross-sectional view of a non-planar integrated circuit structure as taken along a gate line, in accordance with an embodiment of the present disclosure.

Figure 3:
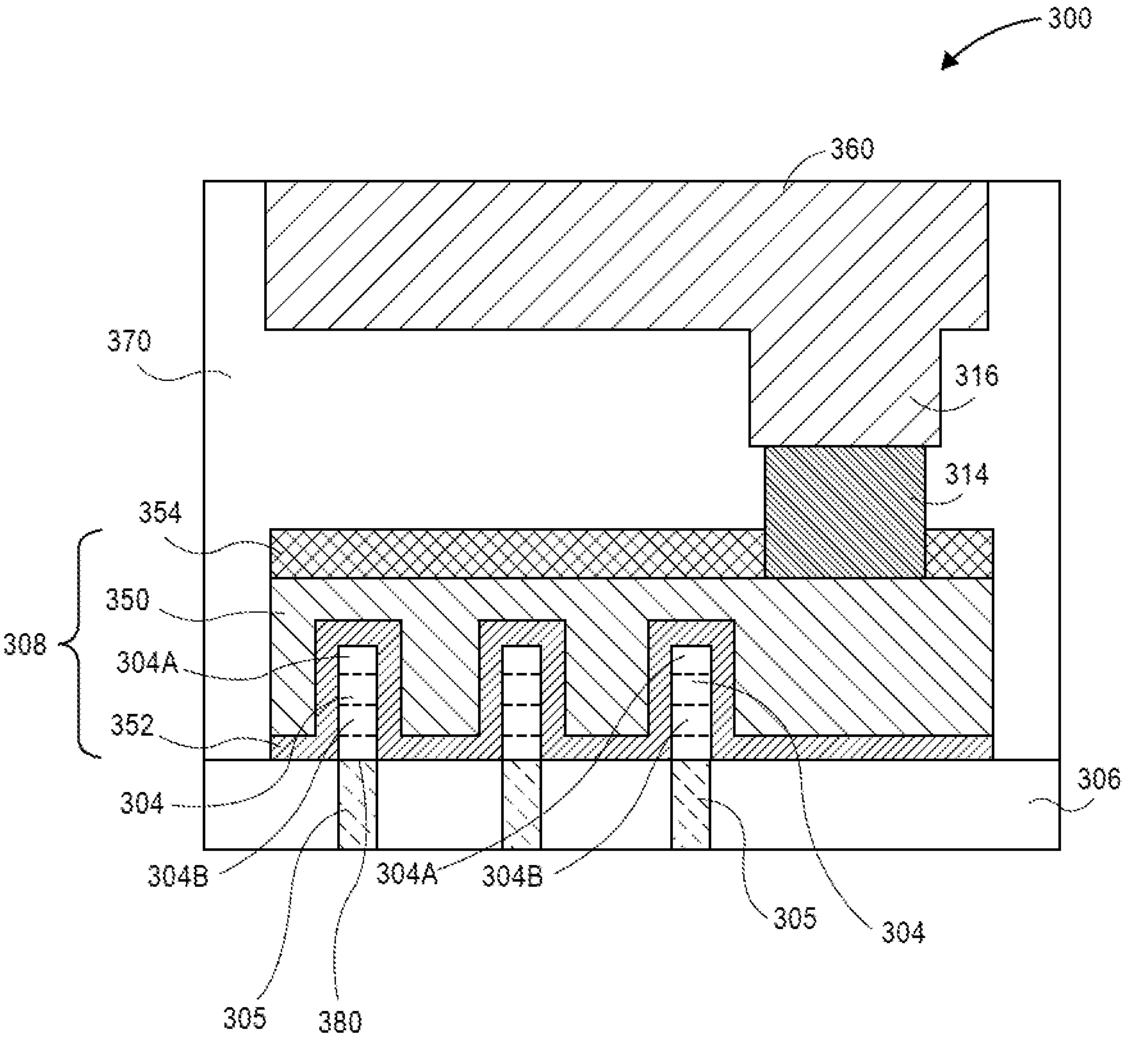
FIG. 3 illustrates a cross-sectional view of a non-planar integrated circuit structure as taken along a gate line, in accordance with an embodiment of the present disclosure.

Referring to FIG. 3, a semiconductor structure or device 300 includes a non-planar active region (e.g., a solid fin structure including protruding fin portion 304 and sub-fin region 305) within a trench isolation region 306. In another embodiment, instead of a solid fin, the non-planar active region is separated into nano-wires (such as nano-wires 304A and 304B) above sub-fin region 305, as is represented by the dashed lines. In either case, for ease of description for non-planar integrated circuit structure 300, a non-planar active region 304 is referenced below as a protruding fin portion. It is to be appreciated that, in one embodiment, there is no bulk substrate coupled to the sub-fin region 305.

A gate line 308 is disposed over the protruding portions 304 of the non-planar active region (including, if applicable, surrounding nano-wires 304A and 304B), as well as over a portion of the trench isolation region 306. As shown, gate line 308 includes a gate electrode 350 and a gate dielectric layer 352. In one embodiment, gate line 308 may also include a dielectric cap layer 354. A gate contact 314, and overlying gate contact via 316 are also seen from this perspective, along with an overlying metal interconnect 360, all of which are disposed in inter-layer dielectric stacks or layers 370. Also seen from the perspective of FIG. 3, the gate contact 314 is, in one embodiment, disposed over trench isolation region 306, but not over the non-planar active regions.

In an embodiment, the semiconductor structure or device 300 is a non-planar device such as, but not limited to, a fin-FET device, a tri-gate device, a nano-ribbon device, or a nano-wire device. In such an embodiment, a corresponding semiconducting channel region is composed of or is formed in a three-dimensional body. In one such embodiment, the gate electrode stacks of gate lines 308 surround at least a top surface and a pair of sidewalls of the three-dimensional body.

As is also depicted in FIG. 3, in an embodiment, an interface 380 exists between a protruding fin portion 304 and sub-fin region 305. The interface 380 can be a transition region between a doped sub-fin region 305 and a lightly or undoped upper fin portion 304. In one such embodiment, each fin is approximately 10 nanometers wide or less, and sub-fin dopants are supplied from an adjacent solid state doping layer at the sub-fin location. In a particular such embodiment, each fin is less than 10 nanometers wide. In another embodiment, the sub-fin region is a dielectric material, formed by recessing the fin through a wet or dry etch, and filling the recessed cavity with a conformal or flowable dielectric.

Although not depicted in FIG. 3, it is to be appreciated that source or drain regions of or adjacent to the protruding fin portions 304 are on either side of the gate line 308, i.e., into and out of the page. In one embodiment, the source or drain regions are doped portions of original material of the protruding fin portions 304. In another embodiment, the material of the protruding fin portions 304 is removed and replaced with another semiconductor material, e.g., by epitaxial deposition to form discrete epitaxial nubs or non-discrete epitaxial structures. In either embodiment, the source or drain regions may extend below the height of dielectric layer of trench isolation region 306, i.e., into the sub-fin region 305. In accordance with an embodiment of the present disclosure, the more heavily doped sub-fin regions, i.e., the doped portions of the fins below interface 380, inhibits source to drain leakage through this portion of the bulk semiconductor fins.

With reference again to FIG. 3, in an embodiment, fins 304/305 (and, possibly nano-wires 304A and 304B) are composed of a crystalline silicon, silicon/germanium or germanium layer doped with a charge carrier, such as but not limited to phosphorus, arsenic, boron or a combination thereof. In one embodiment, the concentration of silicon atoms is greater than 93%. In another embodiment, fins 304/305 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. Trench isolation region 306 may be composed of a dielectric material such as, but not limited to, silicon dioxide, silicon oxy-nitride, silicon nitride, or carbon-doped silicon nitride.

Gate line 308 may be composed of a gate electrode stack which includes a gate dielectric layer 352 and a gate electrode layer 350. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin 304. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 314 and overlying gate contact via 316 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 308 is formed while eliminating the use of a lithographic step with exceedingly tight registration budget. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 300 involves fabrication of the gate stack structure 308 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 3, the arrangement of semiconductor structure or device 300 places the gate contact over isolation regions. Such an arrangement may be viewed as inefficient use of layout space. In another embodiment, however, a semiconductor device has contact structures that contact portions of a gate electrode formed over an active region, e.g., over a sub-fin 305, and in a same layer as a trench contact via.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a tri-gate device, an independently accessed double gate device, a gate-all-around (GAA) device, a nano-wire device, a nano-ribbon device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion lithography (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that, as used throughout the disclosure, a sub-fin, a nano-wire, a nano-ribbon, or a fin described herein may be a silicon sub-fin, a silicon nanowire, a silicon nano-ribbon, or a silicon fin. As used throughout, a silicon layer or structure may be used to describe a silicon material composed of a very substantial amount of, if not all, silicon. However, it is to be appreciated that, practically, 100% pure Si may be difficult to form and, hence, could include a tiny percentage of carbon, germanium or tin. Such impurities may be included as an unavoidable impurity or component during deposition of Si or may "contaminate" the Si upon diffusion during post deposition processing. As such, embodiments described herein directed to a silicon layer or structure may include a silicon layer or structure that contains a relatively small amount, e.g., "impurity" level, non-Si atoms or species, such as Ge, C or Sn. It is to be appreciated that a silicon layer or structure as described herein may be undoped or may be doped with dopant atoms such as boron, phosphorous or arsenic.

It is to be appreciated that, as used throughout the disclosure, a sub-fin, a nano-wire, a nano-ribbon, or a fin described herein may be a silicon germanium sub-fin, a silicon germanium nano-wire, a silicon germanium nano-ribbon, or a silicon germanium fin. As used throughout, a silicon germanium layer or structure may be used to describe a silicon germanium material composed of substantial portions of both silicon and germanium, such as at least 5% of both. In some embodiments, the amount of germanium is greater than the amount of silicon. In particular embodiments, a silicon germanium layer or structure includes approximately 60% germanium and approximately 40% silicon ($Si_{40}Ge_{60}$). In other embodiments, the amount of silicon is greater than the amount of germanium. In particular embodiments, a silicon germanium layer or structure includes approximately 30% germanium and approximately 70% silicon ($Si_{70}Ge_{30}$). It is to be appreciated that, practically, 100% pure silicon germanium (referred to generally as SiGe) may be difficult to form and, hence, could include a tiny percentage of carbon or tin. Such impurities may be included as an unavoidable impurity or component during deposition of SiGe or may "contaminate" the SiGe upon diffusion during post deposition processing. As such, embodiments described herein directed to a silicon germanium layer or structure may include a silicon germanium layer or structure that contains a relatively small amount, e.g., "impurity" level, non-Ge and non-Si atoms or species, such as carbon or tin. It is to be appreciated that a silicon germanium layer or structure as described herein may be undoped or may be doped with dopant atoms such as boron, phosphorous or arsenic.

In another aspect, integrated circuit structures described herein may be fabricated using a backside reveal of front side structures fabrication approach. In some exemplary embodiments, reveal of the backside of a transistor or other device structure entails wafer-level backside processing. In contrast to a conventional TSV-type technology, a reveal of the backside of a transistor as described herein may be performed at the density of the device cells, and even within sub-regions of a device. Furthermore, such a reveal of the backside of a transistor may be performed to remove substantially all of a donor substrate upon which a device layer was disposed during front side device processing. As such, a microns-deep TSV becomes unnecessary with the thickness of semiconductor in the device cells following a reveal of the backside of a transistor potentially being only tens or hundreds of nanometers.

Reveal techniques described herein may enable a paradigm shift from "bottom-up" device fabrication to "center-out" fabrication, where the "center" is any layer that is employed in front side fabrication, revealed from the backside, and again employed in backside fabrication. Processing of both a front side and revealed backside of a device structure may address many of the challenges associated with fabricating 3D ICs when primarily relying on front side processing.

A reveal of the backside of a transistor approach may be employed for example to remove at least a portion of a carrier layer and intervening layer of a donor-host substrate assembly, for example as illustrated in FIGS. 4A-4H and 5A-5H, described below. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the backside surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the backside surface of the donor substrate during the polishing or etching performed. In some other embodiments, the endpoint criteria are associated with a change in optical absorbance or emission of byproducts during the polishing or etching of the donor substrate backside surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the backside surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a backside surface of the donor substrate and a polishing surface in contact with the backside surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions there in. In some embodiments, the backside device layer processing includes a further polish or wet/dry etch through a thickness of the device layer disposed between the intervening layer and a device region previously fabricated in the device layer, such as a source or drain region.

In some embodiments where the carrier layer, intervening layer, or device layer backside is recessed with a wet and/or plasma etch, such an etch may be a patterned etch or a materially selective etch that imparts significant non-planarity or topography into the device layer backside surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for backside device layer patterning. Hence, a masked etch process may preface a correspondingly masked device layer etch.

The above described processing scheme may result in a donor-host substrate assembly that includes IC devices that have a backside of an intervening layer, a backside of the device layer, and/or backside of one or more semiconductor regions within the device layer, and/or front side metallization revealed. Additional backside processing of any of these revealed regions may then be performed during downstream processing.

In accordance with one or more embodiments of the present disclosure, in order to enable backside access to a partitioned source or drain contact structure, a double-sided device processing scheme may be practiced at the wafer-level. In some exemplary embodiments, a large formal substrate (e.g., 300 or 450 mm diameter) wafer may be processed. In an exemplary processing scheme, a donor substrate including a device layer is provided. In some embodiments, the device layer is a semiconductor material that is employed by an IC device. As one example, in a transistor device, such as a field effect transistor (FET), the channel semiconductor is formed from the semiconductor device layer. As another example, for an optical device, such as a photodiode, the drift and/or gain semiconductor is formed from the device layer. The device layer may also be employed in a passive structure with an IC device. For example, an optical waveguide may employ semiconductor patterned from the device layer.

In some embodiments, the donor substrate includes a stack of material layers. Such a material stack may facilitate subsequent formation of an IC device stratum that includes the device layer but lacks other layers of the donor substrate. In an exemplary embodiment, the donor substrate includes a carrier layer separated from the device layer by one or more intervening material layers. The carrier layer is to provide mechanical support during front side processing of the device layer. The carrier may also provide the basis for crystallinity in the semiconductor device layer. The intervening layer(s) may facilitate removal of the carrier layer and/or the reveal of the device layer backside.

Front side fabrication operations are then performed to form a device structure that includes one or more regions in the device layer. Any known front side processing techniques may be employed to form any known IC device and exemplary embodiments are further described elsewhere herein. A front side of the donor substrate is then joined to a host substrate to form a device-host assembly. The host substrate is to provide front side mechanical support during backside processing of the device layer. The host substrate may also entail integrated circuitry with which the IC devices fabricated on the donor substrate are interconnected. For such embodiments, joining of the host and donor substrate may further entail formation of 3D interconnect structures through hybrid (dielectric/metal) bonding. Any known host substrate and wafer-level joining techniques may be employed.

The process flow continues where the backside of the device stratum is revealed by removing at least a portion of the carrier layer. In some further embodiments, portions of any intervening layer and/or front side materials deposited over the device layer may also be removed during the reveal operation. As described elsewhere herein in the context of some exemplary embodiments, an intervening layer(s) may facilitate a highly-uniform exposure of the device stratum backside, for example serving as one or more of an etch marker or etch stop employed in the wafer-level backside reveal process. Device stratum surfaces exposed from the backside are processed to form a double-side device stratum. Native materials, such as any of those of the donor substrate, which interfaced with the device regions may then be replaced with one or more non-native materials. For example, a portion of a semiconductor device layer or intervening layer may be replaced with one or more other semiconductor, metal, or dielectric materials. In some further embodiments, portions of the front side materials removed during the reveal operation may also be replaced. For example, a portion of a dielectric spacer, gate stack, or contact metallization formed during front side device fabrication may be replaced with one or more other semiconductor, metal, or dielectric materials during backside deprocessing/reprocessing of the front side device. In still other embodiments, a second device stratum or metal interposer is bonded to the reveal backside.

The above process flow provides a device stratum-host substrate assembly. The device stratum-host assembly may then be further processed. For example, any known technique may be employed to singulate and package the device stratum-host substrate assembly. Where the host substrate is entirely sacrificial, packaging of the device stratum-host substrate may entail separation of the host substrate from the device stratum. Where the host substrate is not entirely sacrificial (e.g., where the host substrate also includes a device stratum), the device stratum-host assembly output may be fed back as a host substrate input during a subsequent iteration of the above process flow. Iteration of the above approach may thus form a wafer-level assembly of any number of double-side device strata, each only tens or hundreds of nanometers in thickness, for example. In some embodiments, and as further described elsewhere herein, one or more device cells within a device stratum are electrically tested, for example as a yield control point in the fabrication of a wafer-level assembly of double-side device strata. In some embodiments, the electrical test entails backside device probing.

FIGS. 4A-4H illustrate plan views of a substrate processed with double-sided device processing methods, in accordance with some embodiments. FIGS. 5A-5H illustrate cross-sectional views of a substrate processed with double-sided device processing methods, in accordance with some embodiments.

Figure 4A:
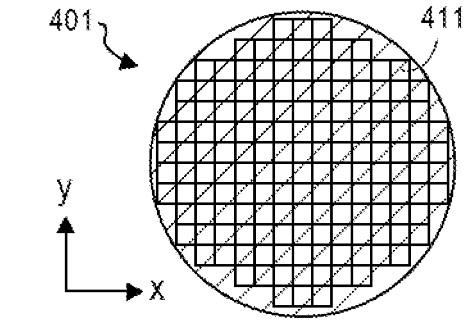
FIGS. 4A-4H illustrate plan views of a substrate processed with double-sided device processing methods, in accordance with some embodiments.
Figure 5A:
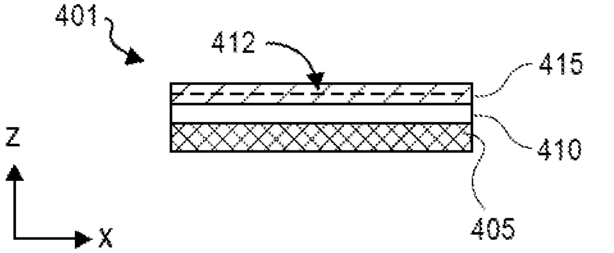
FIGS. 5A-5H illustrate cross-sectional views of a substrate processed with double-sided device processing methods, in accordance with some embodiments.

As shown in FIGS. 4A and 5A, donor substrate 401 includes a plurality of IC die 411 in an arbitrary spatial layout over a front side wafer surface. Front side processing of IC die 411 may have been performed following any techniques to form any device structures. In exemplary embodiments, die 411 include one or more semiconductor regions within device layer 415. An intervening layer 410 separates device layer 415 from carrier layer 405. In the exemplary embodiment, intervening layer 410 is in direct contact with both carrier layer 405 and device layer 415. Alternatively, one or more spacer layers may be disposed between intervening layer 410 and device layer 415 and/or carrier layer 405. Donor substrate 401 may further include other layers, for example disposed over device layer 415 and/or below carrier layer 405.

Device layer 415 may include one or more layers of any device material composition known to be suitable for a particular IC device, such as, but not limited to, transistors, diodes, and resistors. In some exemplary embodiments, device layer 415 includes one or more group IV (i.e., IUPAC group 14) semiconductor material layers (e.g., Si, Ge, SiGe), group III-V semiconductor material layers (e.g., GaAs, InGaAs, InAs, InP), or group III-N semiconductor material layers (e.g., GaN, AlGaN, InGaN). Device layer 415 may also include one or more semiconductor transition metal dichalcogenide (TMD or TMDC) layers. In other embodiments, device layer 415 includes one or more graphene layer, or a graphenic material layer having semiconductor properties. In still other embodiments, device layer 415 includes one or more oxide semiconductor layers. Exemplary oxide semiconductors include oxides of a transition metal (e.g., IUPAC group 4-10) or post-transition metal (e.g., IUPAC groups 11-14). In advantageous embodiments, the oxide semiconductor includes at least one of Cu, Zn, Sn, Ti, Ni, Ga, In, Sr, Cr, Co, V, or Mo. The metal oxides may be suboxides ($A_2O$) monoxides (AO), binary oxides ($AO_2$), ternary oxides ($ABO_3$), and mixtures thereof. In other embodiments, device layer 415 includes one or more magnetic, ferromagnetic, ferroelectric material layer. For example device layer 415 may include one or more layers of any material known to be suitable for an tunneling junction device, such as, but not limited to a magnetic tunneling junction (MTJ) device.

In some embodiments, device layer 415 is substantially monocrystalline. Although monocrystalline, a significant number of crystalline defects may nonetheless be present. In other embodiments, device layer 415 is amorphous or nanocrystalline. Device layer 415 may be any thickness (e.g., z-dimension in FIG. 5A). In some exemplary embodiments, device layer 415 has a thickness greater than a z-thickness of at least some of the semiconductor regions employed by die 411 as functional semiconductor regions of die 411 built on and/or embedded within device layer 415 need not extend through the entire thickness of device layer 415. In some embodiments, semiconductor regions of die 411 are disposed only within a top-side thickness of device layer 415 demarked in FIG. 5A by dashed line 412. For example, semiconductor regions of die 411 may have a z-thickness of 200-300 nm, or less, while device layer may have a z-thickness of 700-1000 nm, or more. As such, around 600 nm of device layer thickness may separate semiconductor regions of die 411 from intervening layer 410.

Carrier layer 405 may have the same material composition as device layer 415, or may have a material composition different than device layer 415. For embodiments where carrier layer 405 and device layer 415 have the same composition, the two layers may be identified by their position relative to intervening layer 410. In some embodiments where device layer 415 is a crystalline group IV, group III-V or group III-N semiconductor, carrier layer 405 is the same crystalline group IV, group III-V or group III-N semiconductor as device layer 415. In alternative embodiments, where device layer 415 is a crystalline group IV, group III-V or group III-N semiconductor, carrier layer 405 is a different crystalline group IV, group III-V or group III-N semiconductor than device layer 415. In still other embodiments, carrier layer 405 may include, or be, a material onto which device layer 415 transferred, or grown upon. For example, carrier layer may include one or more amorphous oxide layers (e.g., glass) or crystalline oxide layer (e.g., sapphire), polymer sheets, or any material(s) built up or laminated into a structural support known to be suitable as a carrier during IC device processing. Carrier layer 405 may be any thickness (e.g., z-dimension in FIG. 5A) as a function of the carrier material properties and the substrate diameter. For example, where the carrier layer 405 is a large format (e.g., 300-450 mm) semiconductor substrate, the carrier layer thickness may be 700-1000 μm, or more.

In some embodiments, one or more intervening layers 410 are disposed between carrier layer 405 and device layer 415. In some exemplary embodiments, an intervening layer 410 is compositionally distinct from carrier layer 405 such that it may serve as a marker detectable during subsequent removal of carrier layer 405. In some such embodiments, an intervening layer 410 has a composition that, when exposed to an etchant of carrier layer 405 will etch at a significantly slower rate than carrier layer 405 (i.e., intervening layer 410 functions as an etch stop for a carrier layer etch process). In further embodiments, intervening layer 410 has a composition distinct from that of device layer 415. Intervening layer 410 may be a metal, semiconductor, or dielectric material, for example.

In some exemplary embodiments where at least one of carrier layer 405 and device layer 415 are crystalline semiconductors, intervening layer 410 is also a crystalline semiconductor layer. Intervening layer 410 may further have the same crystallinity and crystallographic orientation as carrier layer 405 and/or device layer 415. Such embodiments may have the advantage of reduced donor substrate cost relative to alternative embodiments where intervening layer 410 is a material that necessitates bonding (e.g., thermal-compression bonding) of intervening layer 410 to intervening layer 410 and/or to carrier layer 405.

For embodiments where intervening layer 410 is a semiconductor, one or more of the primary semiconductor lattice elements, alloy constituents, or impurity concentrations may vary between at least carrier layer 405 and intervening layer 410. In some embodiments where at least carrier layer 405 is a group IV semiconductor, intervening layer 410 may also be a group IV semiconductor, but of a different group IV element or alloy and/or doped with an impurity species to an impurity level different than that of carrier layer 405. For example, intervening layer 410 may be a silicon-germanium alloy epitaxially grown on a silicon carrier. For such embodiments, a pseudomorphic intervening layer may be grown heteroepitaxially to any thickness below the critical thickness. Alternatively, the intervening layer 410 may be a relaxed buffer layer having a thickness greater than the critical thickness.

In other embodiments, where at least carrier layer 405 is a group III-V semiconductor, intervening layer 410 may also be a group III-V semiconductor, but of a different group III-V alloy and/or doped with an impurity species to an impurity level different than that of carrier layer 405. For example, intervening layer 410 may be an AlGaAs alloy epitaxially grown on a GaAs carrier. In some other embodiments where both carrier layer 405 and device layer 415 are crystalline semiconductors, intervening layer 410 is also a crystalline semiconductor layer, which may further have the same crystallinity and crystallographic orientation as carrier layer 405 and/or device layer 415.

In embodiments where both carrier layer 405 and intervening layer 410 are of the same or different primary semiconductor lattice elements, impurity dopants may differentiate the carrier and intervening layer. For example, intervening layer 410 and carrier layer 405 may both be silicon crystals with intervening layer 410 lacking an impurity present in carrier layer 405, or doped with an impurity absent from carrier layer 405, or doped to a different level with an impurity present in carrier layer 405. The impurity differentiation may impart etch selectivity between the carrier and intervening layer, or merely introduce a detectable species.

Intervening layer 410 may be doped with impurities that are electrically active (i.e., rendering it an n-type or p-type semiconductor), or not, as the impurity may provide any basis for detection of the intervening layer 410 during subsequent carrier removal. Exemplary electrically active impurities for some semiconductor materials include group III elements (e.g., B), group IV elements (e.g., P). Any other element may be employed as a non-electrically active species. Impurity dopant concentration within intervening layer 410 need only vary from that of carrier layer 405 by an amount sufficient for detection, which may be predetermined as a function of the detection technique and detector sensitivity.

As described further elsewhere herein, intervening layer 410 may have a composition distinct from device layer 415. In some such embodiments, intervening layer 410 may have a different band gap than that of device layer 415. For example, intervening layer 410 may have a wider band-gap than device layer 415.

In embodiments where intervening layer 410 includes a dielectric material, the dielectric material may be an inorganic material (e.g., SiO, SiN, SiON, SiOC, hydrogen silsesquioxane, methyl silsesquioxane) or organic material (polyimide, polynorbornenes, benzocyclobutene). For some dielectric embodiments, intervening layer 410 may be formed as an embedded layer (e.g., SiOx through implantation of oxygen into a silicon device and/or carrier layer). Other embodiments of a dielectric intervening layer may necessitate bonding (e.g., thermal-compression bonding) of carrier layer 405 to device layer 415. For example, where donor substrate 401 is a semiconductor-on-oxide (SOI) substrate, either or both of carrier layer 405 and device layer 415 may be oxidized and bonded together to form a SiO intervening layer 410. Similar bonding techniques may be employed for other inorganic or organic dielectric materials.

In some other embodiments, intervening layer 410 includes two or more materials laterally spaced apart within the layer. The two or more materials may include a dielectric and a semiconductor, a dielectric and a metal, a semiconductor and a metal, a dielectric and a metal, two different dielectric, two different semiconductors, or two different metals. Within such an intervening layer, a first material may surround islands of the second material that extend through the thickness of the intervening layer. For example, an intervening layer may include a field isolation dielectric that surrounds islands of semiconductor, which extend through the thickness of the intervening layer. The semiconductor may be epitaxially grown within openings of a patterned dielectric or the dielectric material may be deposited within openings of a patterned semiconductor.

In some exemplary embodiments, semiconductor features, such as fins or mesas, are etched into a front side surface of a semiconductor device layer. Trenches surrounding these features may be subsequently backfilled with an isolation dielectric, for example following any known shallow trench isolation (STI) process. One or more of the semiconductor feature or isolation dielectric may be employed for terminating a backside carrier removal process, for example as a backside reveal etch stop. In some embodiments, a reveal of trench isolation dielectric may stop, significantly retard, or induce a detectable signal for terminating a backside carrier polish. For example, a CMP polish of carrier semiconductor employing a slurry that has high selectivity favoring removal of carrier semiconductor (e.g., Si) over removal of isolation dielectric (e.g., SiO) may be significantly slowed upon exposure of a (bottom) surface of the trench isolation dielectric surrounding semiconductor features including the device layer. Because the device layer is disposed on a front side of intervening layer, the device layer need not be directly exposed to the backside reveal process.

Notably, for embodiments where the intervening layer includes both semiconductor and dielectric, the intervening layer thickness may be considerably greater than the critical thickness associated with the lattice mismatch of the intervening layer and carrier. Whereas an intervening layer below critical thickness may be an insufficient thickness to accommodate non-uniformity of a wafer-level backside reveal process, embodiments with greater thickness may advantageously increase the backside reveal process window. Embodiments with pin-holed dielectric may otherwise facilitate subsequent separation of carrier and device layers as well as improve crystal quality within the device layer.

Semiconductor material within intervening layers that include both semiconductor and dielectric may also be homoepitaxial. In some exemplary embodiments, a silicon epitaxial device layer is grown through a pin-holed dielectric disposed over a silicon carrier layer.

Continuing with description of FIGS. 4A and 5A, intervening layer 410 may also be a metal. For such embodiments, the metal may be of any composition known to be suitable for bonding to carrier layer 405 or device layer 415. For example, either or both of carrier layer 405 and device layer 415 may be finished with a metal, such as, but not limited to Au or Pt, and subsequently bonded together, for example to form an Au or Pt intervening layer 410. Such a metal may also be part of an intervening layer that further includes a patterned dielectric surrounding metal features.

Intervening layer 410 may be of any thickness (e.g., z-height in FIG. 5A). The intervening layer should be sufficiently thick to ensure the carrier removal operation can be reliably terminated before exposing device regions and/or device layer 415. Exemplary thicknesses for intervening layer 410 range from a few hundred nanometers to a few micrometers and may vary as a function of the amount of carrier material that is to be removed, the uniformity of the carrier removal process, and the selectivity of the carrier removal process, for example. For embodiments where the intervening layer has the same crystallinity and crystallographic orientation as carrier layer 405, the carrier layer thickness may be reduced by the thickness of intervening layer 410. In other words, intervening layer 410 may be a top portion of a 700-1000 μm thick group IV crystalline semiconductor substrate also employed as the carrier layer. In pseudomorphic heteroepitaxial embodiments, intervening layer thickness may be limited to the critical thickness. For heteroepitaxial intervening layer embodiments employing aspect ratio trapping (ART) or another fully relaxed buffer architecture, the intervening layer may have any thickness.

Figure 4B:
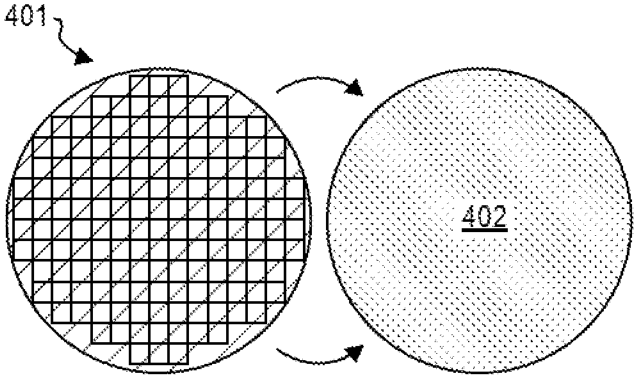
Figure 5B:
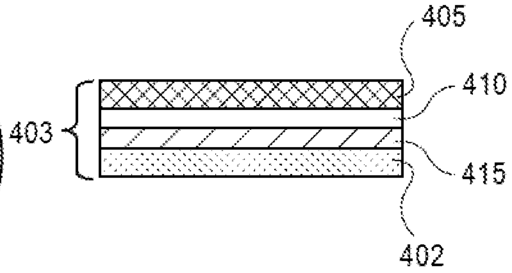

As further illustrated in FIGS. 4B and 5B, donor substrate 401 may be joined to a host substrate 402 to form a donor-host substrate assembly 403. In some exemplary embodiments, a front side surface of donor substrate 401 is joined to a surface of host substrate 402 such that device layer 415 is proximal host substrate 402 and carrier layer 405 is distal from host substrate 402. Host substrate 402 may be any substrate known to be suitable for joining to device layer 415 and/or a front side stack fabricated over device layer 415. In some embodiments, host substrate 402 includes one or more additional device strata. For example, host substrate 402 may further include one or more device layer (not depicted). Host substrate 402 may include integrated circuitry with which the IC devices fabricated in a device layer of host substrate 402 are interconnected, in which case joining of device layer 415 to host substrate 402 may further entail formation of 3D interconnect structures through the wafer-level bond.

Although not depicted in detail by FIG. 5B, any number of front side layers, such as interconnect metallization levels and interlayer dielectric (ILD) layers, may be present between device layer 415 and host substrate 402. Any technique may be employed to join host substrate 402 and donor substrate 401. In some exemplary embodiments further described elsewhere herein, the joining of donor substrate 401 to host substrate 402 is through metal-metal, oxide-oxide, or hybrid (metal/oxide-metal/oxide) thermal compression bonding.

Figure 4C:
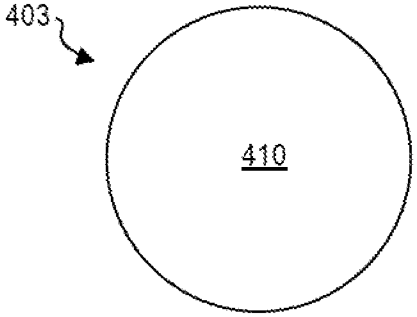
Figure 5C:
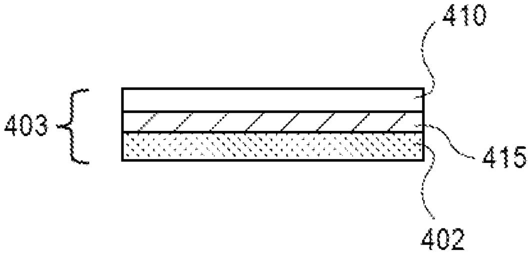

With host substrate 402 facing device layer 415 on a side opposite carrier layer 405, at least a portion of carrier layer 405 may be removed as further illustrated in FIGS. 4C and 5C. Where the entire carrier layer 405 is removed, donor-host substrate assembly 403 maintains a highly uniform thickness with planar backside and front side surfaces. Alternatively, carrier layer 405 may be masked and intervening layer 410 exposed only in unmasked sub-regions to form a non-planar backside surface. In the exemplary embodiments illustrated by FIGS. 4C and 5C, carrier layer 405 is removed from the entire backside surface of donor-host substrate assembly 403. Carrier layer 405 may be removed, for example by cleaving, grinding, and/or polishing (e.g., chemical-mechanical polishing), and/or wet chemical etching, and/or plasma etching through a thickness of the carrier layer to expose intervening layer 410. One or more operations may be employed to remove carrier layer 405. Advantageously, the removal operation(s) may be terminated based on duration or an endpoint signal sensitive to exposure of intervening layer 410.

Figure 4D:
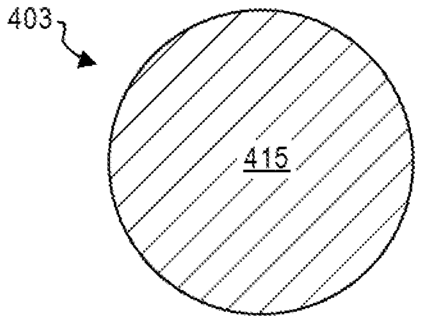
Figure 5D:
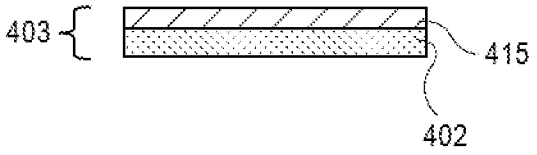

In further embodiments, for example as illustrated by FIGS. 4D and 5D, intervening layer 410 is also at least partially etched to expose a backside of device layer 415. At least a portion of intervening layer 410 may be removed subsequent to its use as a carrier layer etch stop and/or carrier layer etch endpoint trigger. Where the entire intervening layer 410 is removed, donor-host substrate assembly 403 maintains a highly uniform device layer thickness with planar backside and front side surfaces afforded by the intervening layer 410 being much thinner than the carrier layer. Alternatively, intervening layer 410 may be masked and device layer 415 exposed only in unmasked sub-regions, thereby forming a non-planar backside surface. In the exemplary embodiments illustrated by FIGS. 4D and 5D, intervening layer 410 is removed from the entire backside surface of donor-host substrate assembly 403. Intervening layer 410 may be so removed, for example, by polishing (e.g., chemical-mechanical polishing), and/or blanket wet chemical etching, and/or blanket plasma etching through a thickness of the intervening layer to expose device layer 415. One or more operations may be employed to remove intervening layer 410. Advantageously, the removal operation(s) may be terminated based on duration or an endpoint signal sensitive to exposure of device layer 415.

Figure 4E:
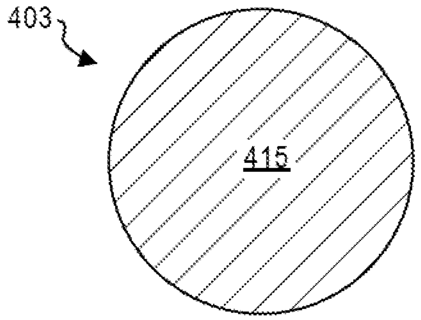
Figure 5E:
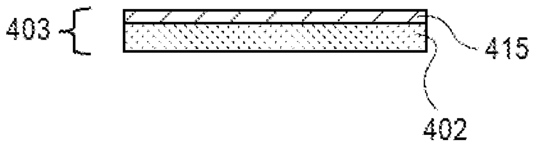
Figure 4F:
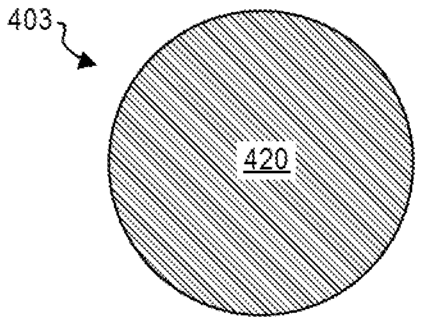
Figure 5F:
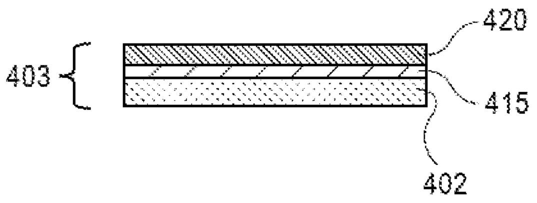
Figure 4G:
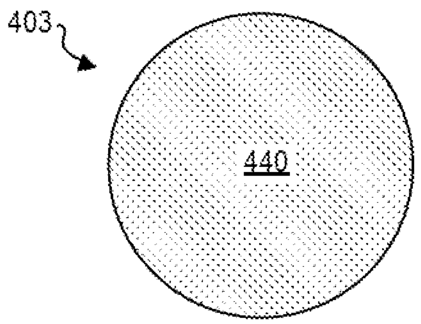
Figure 5G:
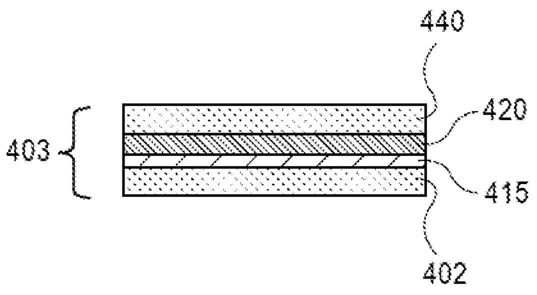
Figure 4H:
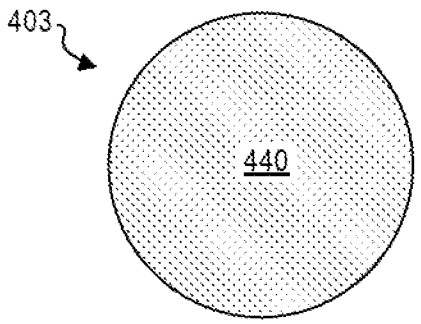
Figure 5H:
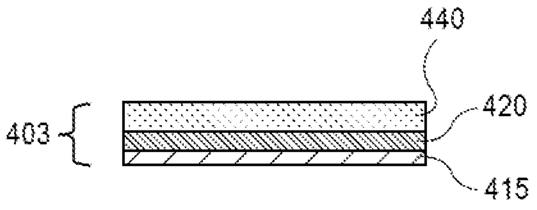

In some further embodiments, for example as illustrated by FIGS. 4E and 5E, device layer 415 is partially etched to expose a backside of a device structure previously formed from during front side processing. At least a portion of device layer 415 may be removed subsequent to its use in fabricating one or more of the device semiconductor regions, and/or its use as an intervening layer etch stop or endpoint trigger. Where device layer 415 is thinned over the entire substrate area, donor-host substrate assembly 403 maintains a highly uniform reduced thickness with planar back and front surfaces. Alternatively, device layer 415 may be masked and device structures (e.g., device semiconductor regions) selectively revealed only in unmasked sub-regions, thereby forming a non-planar backside surface. In the exemplary embodiments illustrated by FIGS. 4E and 5E, device layer 415 is thinned over the entire backside surface of donor-host substrate assembly 403. Device layer 415 may be thinned, for example by polishing (e.g., chemical-mechanical polishing), and/or wet chemical etching, and/or plasma etching through a thickness of the device layer to expose one or more device semiconductor regions, and/or one or more other device structures (e.g., front side device terminal contact metallization, spacer dielectric, etc.) previously formed during front side processing. One or more operations may be employed to thin device layer 415. Advantageously, the device layer thinning may be terminated based on duration or an endpoint signal sensitive to exposure of patterned features within device layer 415. For example, where front side processing forms device isolation features (e.g., shallow trench isolation), backside thinning of device layer 415 may be terminated upon exposing the isolation dielectric material.

A non-native material layer may be deposited over a backside surface of an intervening layer, device layer, and/or specific device regions within device layer 415, and/or over or more other device structures (e.g., front side device terminal contact metallization, spacer dielectric, etc.). One or more materials exposed (revealed) from the backside may be covered with non-native material layer or replaced with such a material. In some embodiments, illustrated by FIGS. 4F and 5F, non-native material layer 420 is deposited on device layer 415. Non-native material layer 420 may be any material having a composition and/or microstructure distinct from that of the material removed to reveal the backside of the device stratum. For example, where intervening layer 410 is removed to expose device layer 415, non-native material layer 420 may be another semiconductor of different composition or microstructure than that of intervening layer 410. In some such embodiments where device layer 415 is a group III-N semiconductor, non-native material layer 420 may also be a group III-N semiconductor of the same or different composition that is regrown upon a revealed backside surface of a group III-N device region. This material may be epitaxially regrown from the revealed group III-N device region, for example, to have better crystal quality than that of the material removed, and/or to induce strain within the device layer and/or device regions within the device layer, and/or to form a vertical (e.g., z-dimension) stack of device semiconductor regions suitable for a stacked device.

In some other embodiments where device layer 415 is a group III-V semiconductor, non-native material layer 420 may also be a group III-V semiconductor of the same or different composition that is regrown upon a revealed backside surface of a group III-V device region. This material may be epitaxially regrown from the revealed group III-V device region, for example, to have relatively better crystal quality than that of the material removed, and/or to induce strain within the device layer or a specific device region within the device layer, and/or to form a vertical stack of device semiconductor regions suitable for a stacked device.

In some other embodiments where device layer 415 is a group IV semiconductor, non-native material layer 420 may also be a group IV semiconductor of the same or different composition that is regrown upon a revealed backside surface of a group IV device region. This material may be epitaxially regrown from the revealed group IV device region, for example, to have relatively better crystal quality than that of the material removed, and/or to induce strain within the device region, and/or to form a stack of device semiconductor regions suitable for a stacked device.

In some other embodiments, non-native material layer 420 is a dielectric material, such as, but not limited to SiO, SiON, SiOC, hydrogen silsesquioxane, methyl silsesquioxane, polyimide, polynorbornenes, benzocyclobutene, or the like. Deposition of such a dielectric may serve to electrically isolate various device structures, such as semiconductor device regions, that may have been previously formed during front side processing of donor substrate 401.

In some other embodiments, non-native material layer 420 is a conductive material, such as any elemental metal or metal alloy known to be suitable for contacting one or more surfaces of device regions revealed from the backside. In some embodiments, non-native material layer 420 is a metallization suitable for contacting a device region revealed from the backside, such as a transistor source or drain region. In embodiments, intermetallic contacts such as NixSiy, TixSiy, Ni:Si:Pt, TiSi, CoSi, etc. may be formed. Additionally, implants may be used to enable robust contacts (e.g., P, Ge, B etc.).

In some embodiments, non-native material layer 420 is a stack of materials, such as a FET gate stack that includes both a gate dielectric layer and a gate electrode layer. As one example, non-native material layer 420 may be a gate dielectric stack suitable for contacting a semiconductor device region revealed from the backside, such as a transistor channel region. Any of the other the materials described as options for device layer 415 may also be deposited over a backside of device layer 415 and/or over device regions formed within device layer 415. For example, non-native material layer 420 may be any of the oxide semiconductors, TMDC, or tunneling materials described above, which may be deposited on the backside, for example, to incrementally fabricate vertically-stacked device strata.

Backside wafer-level processing may continue in any manner known to be suitable for front side processing. For example, non-native material layer 420 may be patterned into active device regions, device isolation regions, device contact metallization, or device interconnects using any known lithographic and etch techniques. Backside wafer-level processing may further fabricate one or more interconnect metallization levels coupling terminals of different devices into an IC. In some embodiments further described elsewhere herein, backside processing may be employed to interconnect a power bus to various device terminals within an IC.

In some embodiments, backside processing includes bonding to a secondary host substrate. Such bonding may employ any layer transfer process to join the backside (e.g., non-native) material layer to another substrate. Following such joining, the former host substrate may be removed as a sacrificial donor to re-expose the front side stack and/or the front side of the device layer. Such embodiments may enable iterative side-to-side lamination of device strata with a first device layer serving as the core of the assembly. In some embodiments illustrated in FIGS. 4G and 5G, secondary host substrate 440 joined to non-native material layer 420 provides at least mechanical support while host substrate 402 is removed.

Any bonding, such as, but not limited to, thermal-compression bonding may be employed to join secondary host substrate 440 to non-native material layer 420. In some embodiments, both a surface layer of secondary host substrate 440 and non-native material layer 420 are continuous dielectric layers (e.g., SiO), which are thermal-compression bonded. In some other embodiments, both a surface layer of secondary host substrate 440 and non-native material layer 420 include a metal layer (e.g., Au, Pt, etc.), which are thermal-compression bonded. In other embodiments, at least one of surface layer of secondary host substrate 440 and non-native material layer 420 are patterned, including both patterned metal surface (i.e., traces) and surrounding dielectric (e.g., isolation), which are thermal-compression bonded to form a hybrid (e.g., metal/oxide) joint. For such embodiments, structural features in the secondary host substrate 440 and the patterned non-native material layer 420 are aligned (e.g., optically) during the bonding process. In some embodiments, non-native material layer 420 includes one or more conductive backside traces coupled to a terminal of a transistor fabricated in device layer 415. The conductive backside trace may, for example, be bonded to metallization on secondary host substrate 440.

Bonding of device strata may proceed from the front side and/or backside of a device layer before or after front side processing of the device layer has been completed. A backside bonding process may be performed after front side fabrication of a device (e.g., transistor) is substantially complete. Alternatively, backside bonding process may be performed prior to completing front side fabrication of a device (e.g., transistor), in which case the front side of the device layer may receive additional processing following the backside bonding process. As further illustrated in FIGS. 4H and 5H, for example, front side processing includes removal of host substrate 402 (as a second donor substrate) to re-expose the front side of device layer 415. At this point, donor-host substrate assembly 403 includes secondary host 440 joined to device layer 415 through non-native material layer 420.

In another aspect, the integrated circuit structures described above in association with FIG. 1B and can be co-integrated with silicon-based backside revealed integrated circuit structures such as neighboring semiconductor structures or devices separated by self-aligned gate endcap (SAGE) structures. Particular embodiments may be directed to integration of multiple width (multi-Wsi) nano-wires and nano-ribbons in a SAGE architecture and separated by a SAGE wall. In an embodiment, nano-wires/nano-ribbons are integrated with multiple Wsi in a SAGE architecture portion of a front-end process flow. Such a process flow may involve integration of nano-wires and nano-ribbons of different Wsi to provide robust functionality of next generation transistors with low power and high performance. Associated epitaxial source or drain regions may be embedded (e.g., portions of nano-wires removed and then source or drain (S/D) growth is performed).

Figure 7:
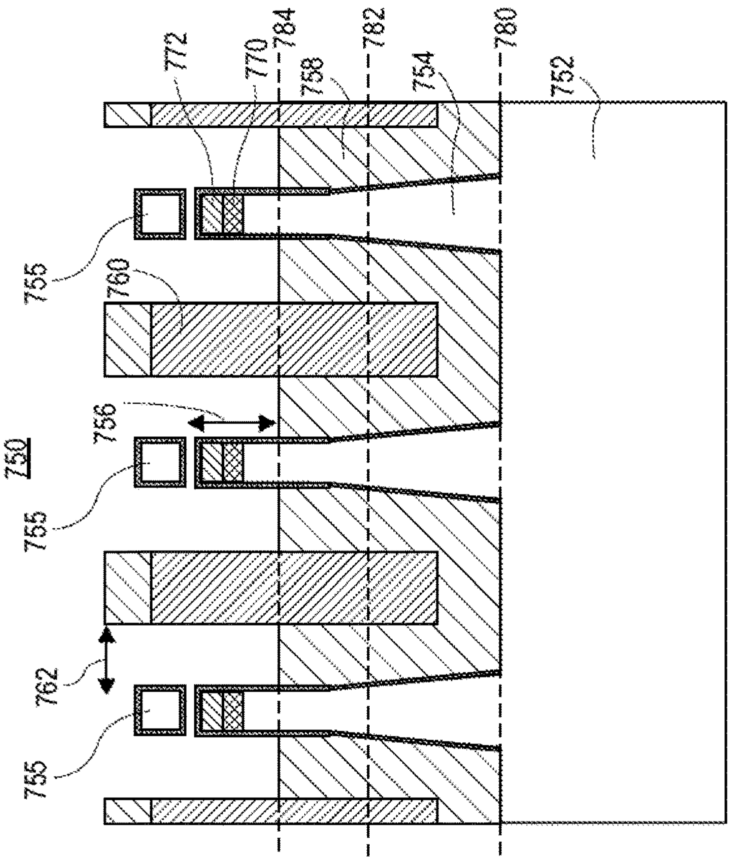
FIG. 7 illustrates a cross-sectional view taken through nano-wires and fins for a self-aligned gate endcap (SAGE) architecture, in accordance with an embodiment of the present disclosure.
Figure 6:
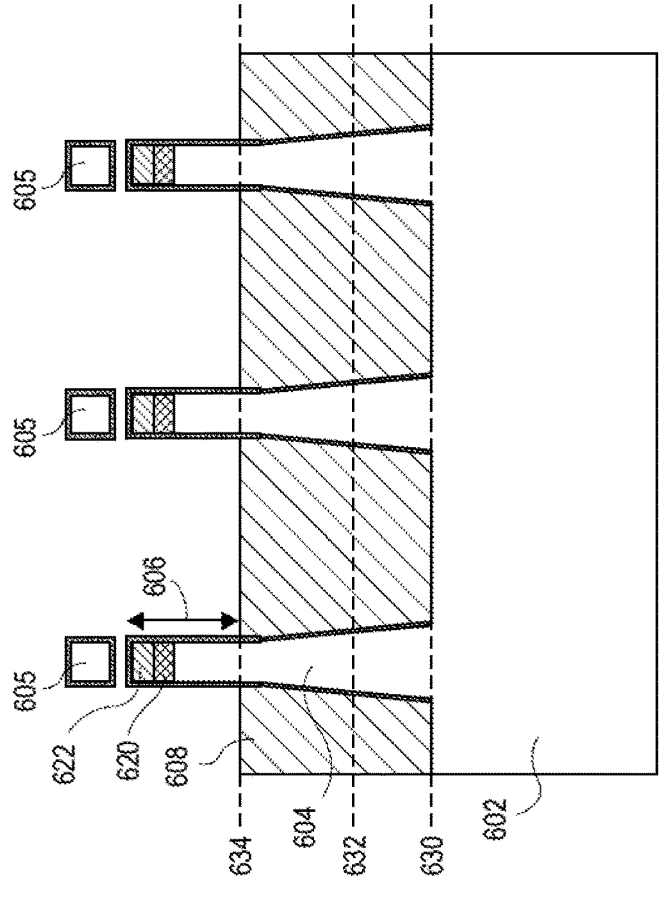
FIG. 6 illustrates a cross-sectional view taken through nano-wires and fins for a non-endcap architecture, in accordance with an embodiment of the present disclosure.

To provide further context, advantages of a self-aligned gate endcap (SAGE) architecture may include the enabling of higher layout density and, in particular, scaling of diffusion-to-diffusion spacing. To provide illustrative comparison, FIG. 6 illustrates a cross-sectional view taken through nano-wires and fins for a non-endcap architecture, in accordance with an embodiment of the present disclosure. FIG. 7 illustrates a cross-sectional view taken through nano-wires and fins for a self-aligned gate endcap (SAGE) architecture, in accordance with an embodiment of the present disclosure.

Referring to FIG. 6, an integrated circuit structure 600 includes a substrate 602 having fins 604 protruding there from by an amount 606 above an isolation structure 608 laterally surrounding lower portions of the fins 604. Upper portions of the fins may include a local isolation structure 622 and a growth enhancement layer 620, as is depicted. Corresponding nano-wires 605 are over the fins 604. A gate structure may be formed over the integrated circuit structure 600 to fabricate a device. However, breaks in such a gate structure may be accommodated for by increasing the spacing between fin 604/nano-wire 605 pairs.

Referring to FIG. 6, in an embodiment, following gate formation, the lower portions of the structure 600 can be planarized and/or etched to level 634 in order to leave a backside surface including exposed bottom surfaces of gate structures and epitaxial source or drain structures. It is to be appreciated that backside (bottom) contacts may be formed on the exposed bottom surfaces of the epitaxial source or drain structures. It is also to be appreciated that planarization and/or etching could be to other levels such as 630 or 632.

By contrast, referring to FIG. 7, an integrated circuit structure 750 includes a substrate 752 having fins 754 protruding therefrom by an amount 756 above an isolation structure 758 laterally surrounding lower portions of the fins 754. Upper portions of the fins may include a local isolation structure 772 and a growth enhancement layer 770, as is depicted. Corresponding nano-wires 755 are over the fins 754. Isolating SAGE walls 760 (which may include a hardmask thereon, as depicted) are included within the isolation structure 758 and between adjacent fin 754/nano-wire 755 pairs. The distance between an isolating SAGE wall 760 and a nearest fin 754/nano-wire 755 pair defines the gate endcap spacing 762. A gate structure may be formed over the integrated circuit structure 750, between insolating SAGE walls to fabricate a device. Breaks in such a gate structure are imposed by the isolating SAGE walls. Since the isolating SAGE walls 760 are self-aligned, restrictions from conventional approaches can be minimized to enable more aggressive diffusion-to-diffusion spacing. Furthermore, since gate structures include breaks at all locations, individual gate structure portions may be layer connected by local interconnects formed over the isolating SAGE walls 760. In an embodiment, as depicted, the isolating SAGE walls 760 each include a lower dielectric portion and a dielectric cap on the lower dielectric portion.

Referring to FIG. 7, in an embodiment, following gate formation, the lower portions of the structure 750 can be planarized and/or etched to level 784 in order to leave a backside surface including exposed bottom surfaces of gate structures and epitaxial source or drain structures. It is to be appreciated that backside (bottom) contacts may be formed on the exposed bottom surfaces of the epitaxial source or drain structures. It is also to be appreciated that planarization and/or etching could be to other levels such as 780 or 782.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

In an embodiment, as described throughout, self-aligned gate endcap (SAGE) isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Figure 8A:
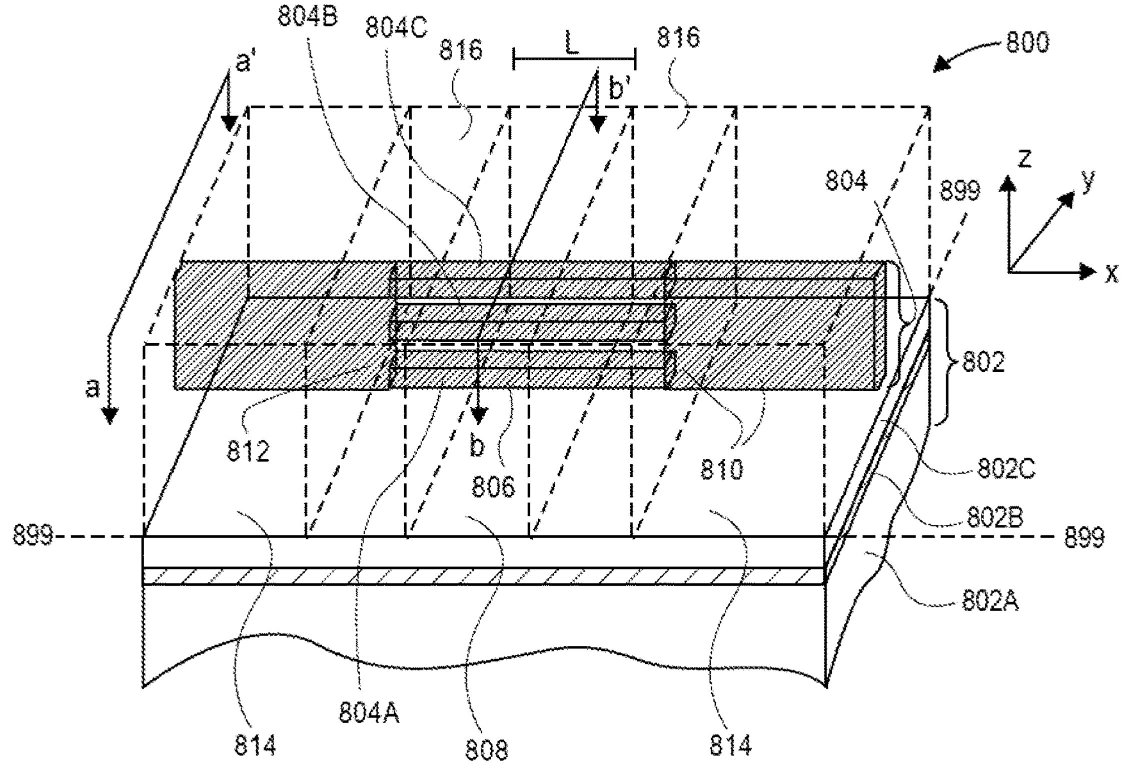
FIG. 8A illustrates a three-dimensional cross-sectional view of a nano-wire-based integrated circuit structure, in accordance with an embodiment of the present disclosure.
Figure 8B:
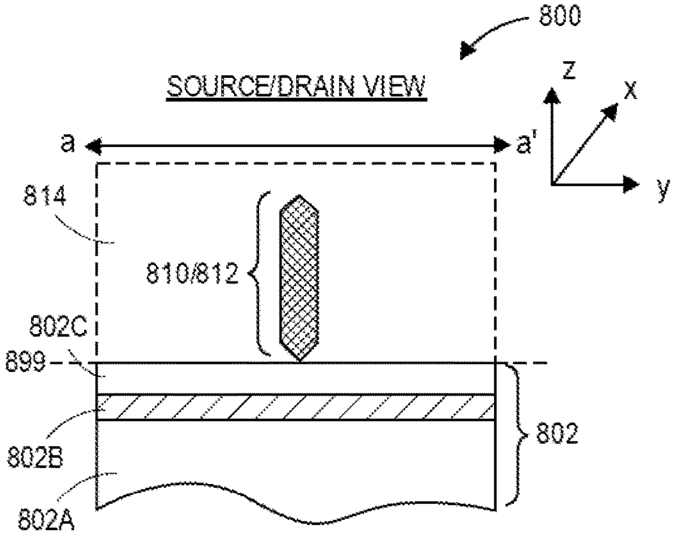
FIG. 8B illustrates a cross-sectional source or drain view of the nano-wire-based integrated circuit structure of FIG. 8A, as taken along the a-a' axis, in accordance with an embodiment of the present disclosure.
Figure 8C:
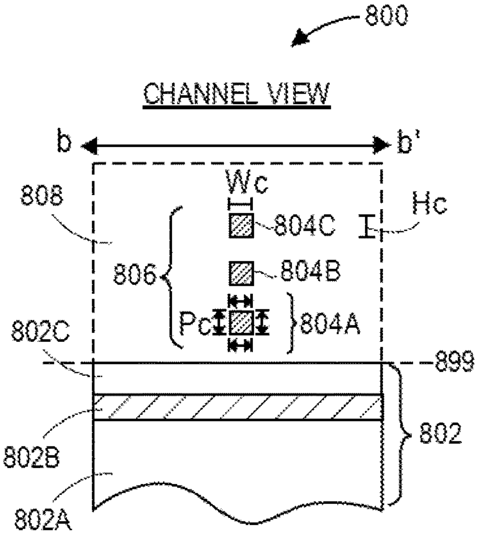
FIG. 8C illustrates a cross-sectional channel view of the nano-wire-based integrated circuit structure of FIG. 8A, as taken along the b-b' axis, in accordance with an embodiment of the present disclosure.

It is to be appreciated that the integrated circuit structures described above in association with FIG. 1B can be co-integrated with silicon-based backside revealed integrated circuit structures such as nano-wire or nano-ribbon based devices. Additionally or alternatively, other integrated circuit structures can be fabricated using processes described in association with FIG. 1B. To highlight an exemplary integrated circuit structure having three vertically arranged nano-wires, FIG. 8A illustrates a three-dimensional cross-sectional view of a nano-wire-based integrated circuit structure, in accordance with an embodiment of the present disclosure. FIG. 8B illustrates a cross-sectional source or drain view of the nano-wire-based integrated circuit structure of FIG. 8A, as taken along the a-a' axis. FIG. 8C illustrates a cross-sectional channel view of the nano-wire-based integrated circuit structure of FIG. 8A, as taken along the b-b' axis.

Referring to FIG. 8A, an integrated circuit structure 800 includes one or more vertically stacked nano-wires (804 set) above a substrate 802. In an embodiment, as depicted, a local isolation structure 802C, a growth enhancement layer 802B, and a lower substrate portion 802A are included in substrate 802, as is depicted. An optional fin below the bottommost nano-wire and formed from the substrate 802 is not depicted for the sake of emphasizing the nano-wire portion for illustrative purposes. Embodiments herein are targeted at both single wire devices and multiple wire devices. As an example, a three nano-wire-based devices having nano-wires 804A, 804B and 804C is shown for illustrative purposes. For convenience of description, nano-wire 804A is used as an example where description is focused on one of the nano-wires. It is to be appreciated that where attributes of one nano-wire are described, embodiments based on a plurality of nano-wires may have the same or essentially the same attributes for each of the nano-wires.

Each of the nano-wires 804 includes a channel region 806 in the nano-wire. The channel region 806 has a length (L). Referring to FIG. 8C, the channel region also has a perimeter (Pc) orthogonal to the length (L). Referring to both FIGS. 8A and 8C, a gate electrode stack 808 surrounds the entire perimeter (Pc) of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nano-wires 804, the channel regions 806 of the nano-wires are also discrete relative to one another.

Referring to both FIGS. 8A and 8B, integrated circuit structure 800 includes a pair of non-discrete source or drain regions 810/812. The pair of non-discrete source or drain regions 810/812 is on either side of the channel regions 806 of the plurality of vertically stacked nano-wires 804. Furthermore, the pair of non-discrete source or drain regions 810/812 is adjoining for the channel regions 806 of the plurality of vertically stacked nano-wires 804. In one such embodiment, not depicted, the pair of non-discrete source or drain regions 810/812 is directly vertically adjoining for the channel regions 806 in that epitaxial growth is on and between nano-wire portions extending beyond the channel regions 806, where nano-wire ends are shown within the source or drain structures. In another embodiment, as depicted in FIG. 8A, the pair of non-discrete source or drain regions 810/812 is indirectly vertically adjoining for the channel regions 806 in that they are formed at the ends of the nano-wires and not between the nano-wires.

In an embodiment, as depicted, the source or drain regions 810/812 are non-discrete in that there are not individual and discrete source or drain regions for each channel region 806 of a nano-wire 804. Accordingly, in embodiments having a plurality of nano-wires 804, the source or drain regions 810/812 of the nano-wires are global or unified source or drain regions as opposed to discrete for each nano-wire. That is, the non-discrete source or drain regions 810/812 are global in the sense that a single unified feature is used as a source or drain region for a plurality (in this case, 3) of nano-wires 804 and, more particularly, for more than one discrete channel region 806. In one embodiment, from a cross-sectional perspective orthogonal to the length of the discrete channel regions 806, each of the pair of non-discrete source or drain regions 810/812 is approximately rectangular in shape with a bottom tapered portion and a top vertex portion, as depicted in FIG. 8B. In other embodiments, however, the source or drain regions 810/812 of the nano-wires are relatively larger yet discrete non-vertically merged epitaxial structures such as nubs.

In accordance with an embodiment of the present disclosure, and as depicted in FIGS. 8A and 8B, integrated circuit structure 800 further includes a pair of contacts 814, each contact 814 on one of the pair of non-discrete source or drain regions 810/812. In one such embodiment, in a vertical sense, each contact 814 completely surrounds the respective non-discrete source or drain region 810/812. In another aspect, the entire perimeter of the non-discrete source or drain regions 810/812 may not be accessible for contact with contacts 814, and the contact 814 thus only partially surrounds the non-discrete source or drain regions 810/812, as depicted in FIG. 8B. In a contrasting embodiment, not depicted, the entire perimeter of the non-discrete source or drain regions 810/812, as taken along the a-a' axis, is surrounded by the contacts 814.

Referring again to FIG. 8A, in an embodiment, integrated circuit structure 800 further includes a pair of spacers 816. As is depicted, outer portions of the pair of spacers 816 may overlap portions of the non-discrete source or drain regions 810/812, providing for "embedded" portions of the non-discrete source or drain regions 810/812 beneath the pair of spacers 816. As is also depicted, the embedded portions of the non-discrete source or drain regions 810/812 may not extend beneath the entirety of the pair of spacers 816.

Substrate 802 may be composed of a material suitable for integrated circuit structure fabrication. In one embodiment, substrate 802 includes a lower bulk substrate composed of a single crystal of a material which may include, but is not limited to, silicon, germanium, silicon-germanium, germanium-tin, silicon-germanium-tin, or a group III-V compound semiconductor material. An upper insulator layer composed of a material which may include, but is not limited to, silicon dioxide, silicon nitride or silicon oxy-nitride is on the lower bulk substrate. Thus, the structure 800 may be fabricated from a starting semiconductor-on-insulator substrate. Alternatively, the structure 800 is formed directly from a bulk substrate and local oxidation is used to form electrically insulative portions in place of the above described upper insulator layer. In another alternative embodiment, the structure 800 is formed directly from a bulk substrate and doping is used to form electrically isolated active regions, such as nano-wires, thereon. In one such embodiment, the first nano-wire (i.e., proximate the substrate) is in the form of an omega-FET type structure.

In an embodiment, the nano-wires 804 may be sized as wires or ribbons, as described below, and may have squared-off or rounder corners. In an embodiment, the nano-wires 804 are composed of a material such as, but not limited to, silicon, germanium, or a combination thereof. In one such embodiment, the nano-wires are single-crystalline. For example, for a silicon nano-wire 804, a single-crystalline nano-wire may be based from a (100) global orientation, e.g., with a <100> plane in the z-direction. As described below, other orientations may also be considered. In an embodiment, the dimensions of the nano-wires 804, from a cross-sectional perspective, are on the nano-scale. For example, in a specific embodiment, the smallest dimension of the nano-wires 804 is less than approximately 20 nanometers. In an embodiment, the nano-wires 804 are composed of a strained material, particularly in the channel regions 806.

Referring to FIGS. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nano-ribbons as described throughout.

Referring again to FIGS. 8A, 8B and 8C, in an embodiment, the lower portions of the structure 800 can be planarized and/or etched to level 899 in order to leave a backside surface including exposed bottom surfaces of gate structures and epitaxial source or drain structures. It is to be appreciated that backside (bottom) contacts may be formed on the exposed bottom surfaces of the epitaxial source or drain structures.

In an embodiment, as described throughout, an integrated circuit structure includes non-planar devices such as, but not limited to, a finFET or a tri-gate structure with corresponding one or more overlying nano-wire structures, and an isolation structure between the finFET or tri-gate structure and the corresponding one or more overlying nano-wire structures. In some embodiments, the finFET or tri-gate structure is retained. In other embodiments, the finFET or tri-gate structure is may ultimately be removed in a substrate removal process.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 9:
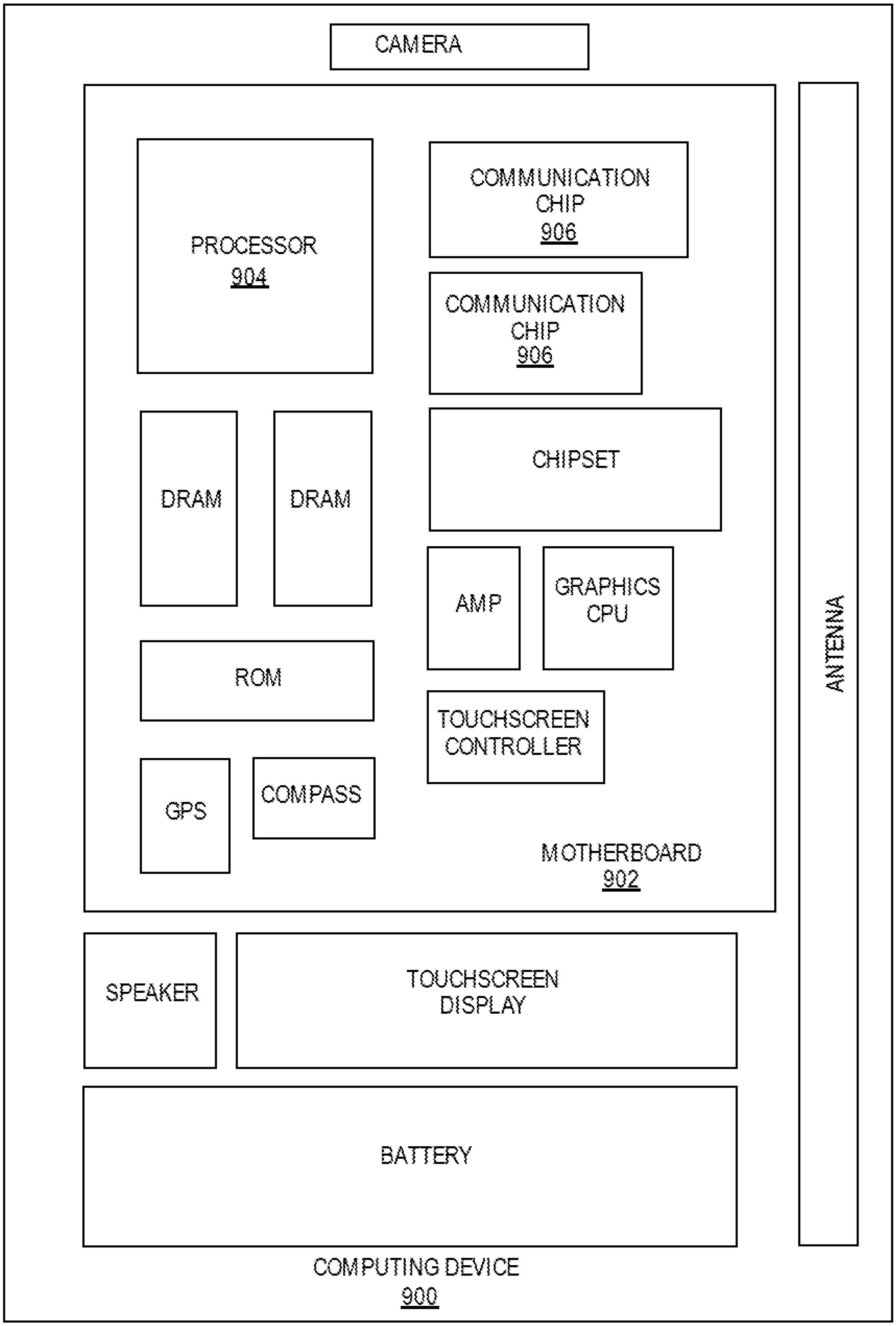
FIG. 9 illustrates a computing device in accordance with one implementation of an embodiment of the disclosure.

FIG. 9 illustrates a computing device 900 in accordance with one implementation of an embodiment of the present disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. The integrated circuit die of the processor 904 may include one or more structures, such as integrated circuit structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. The integrated circuit die of the communication chip 906 may include one or more structures, such as integrated circuit structures built in accordance with implementations of embodiments of the present disclosure.

In further implementations, another component housed within the computing device 900 may contain an integrated circuit die that includes one or structures, such as integrated circuit structures built in accordance with implementations of embodiments of the present disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
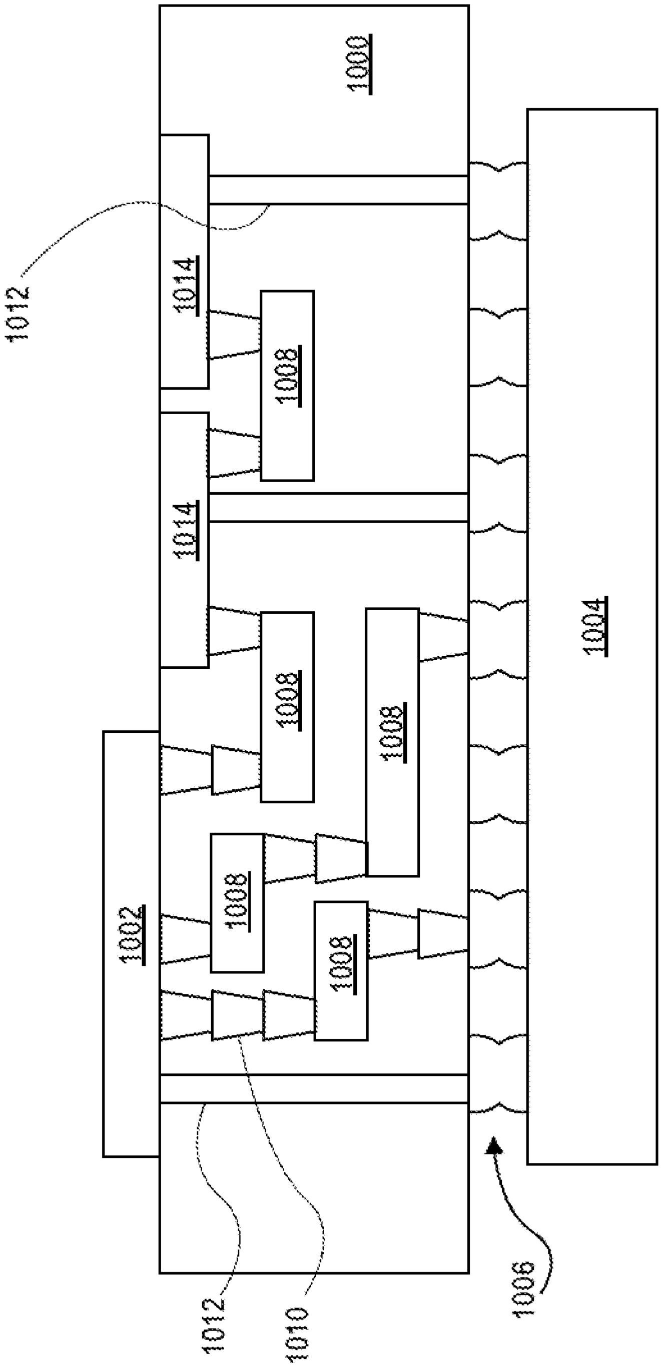
FIG. 10 illustrates an interposer that includes one or more embodiments of the disclosure.

FIG. 10 illustrates an interposer 1000 that includes one or more embodiments of the present disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And, in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000 or in the fabrication of components included in the interposer 1000.

It is to be appreciated that structures described herein may be operated at a low temperature, e.g., in a range of −77 degrees Celsius to 0 degrees Celsius. In one embodiment, a heat regulator/refrigeration device is coupled to a common board having a device with structures such as those described herein coupled thereto, such as described below in association with FIG. 11A. In one embodiment, a heat regulator device and/or refrigeration device is included on a processing device having structures such as those described herein, such as described below in association with FIG. 11B.

Figure 11A:
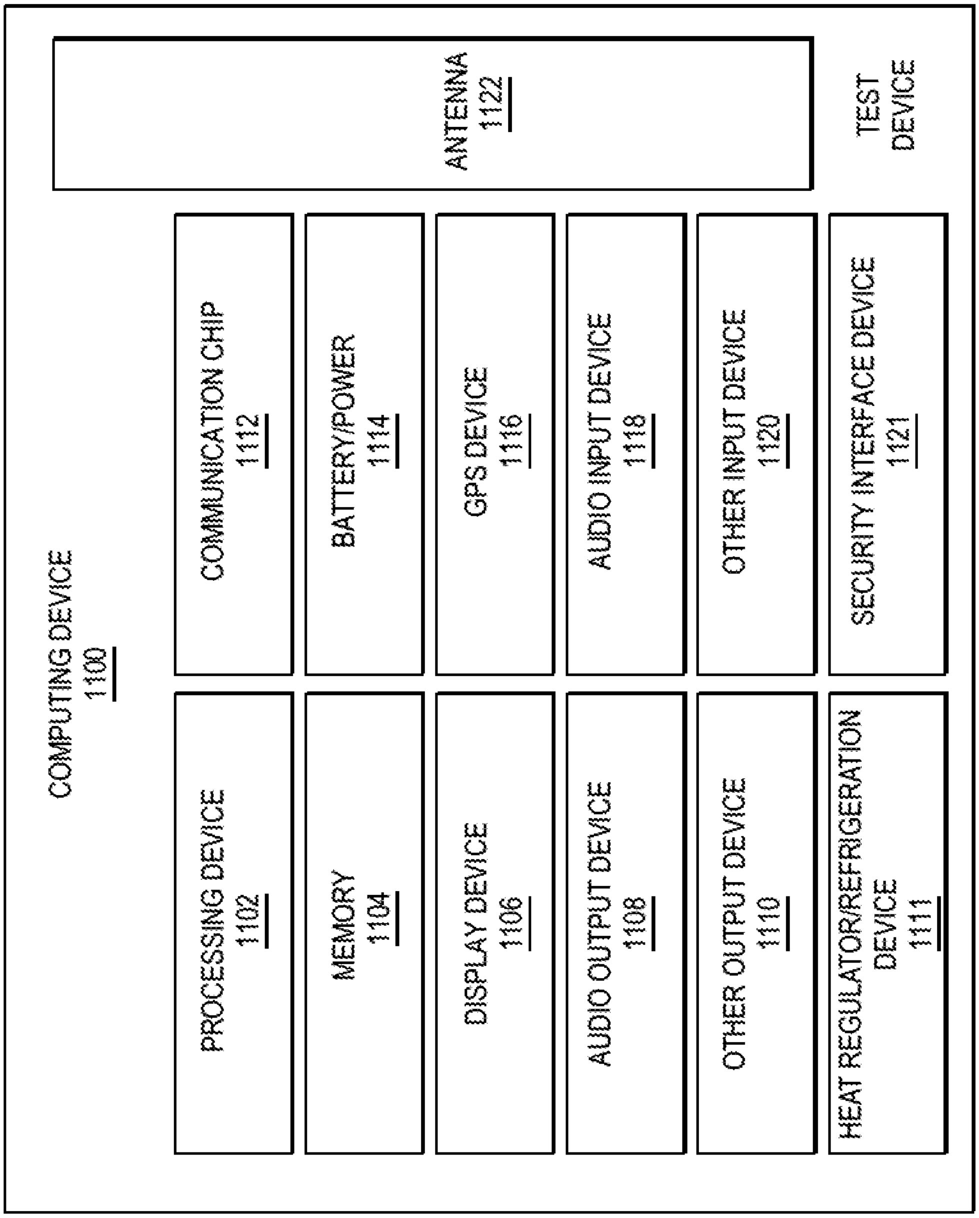
FIG. 11A illustrates a computing device in accordance with one implementation of an embodiment of the present disclosure.

FIG. 11A illustrates a computing device 1100 in accordance with one implementation of an embodiment of the present disclosure. The computing device 1100 houses a board. The board may include a number of components, including but not limited to a processing device 1102. The computing device 1100 can also include communication chip 1112. In one embodiment, the processing device 1102 is physically and electrically coupled to the board. In some implementations the communication chip 1112 is also physically and electrically coupled to the board. In further implementations, the communication chip 1112 is part of the processing device 1102.

Depending on its applications, computing device 1100 may include other components that may or may not be physically and electrically coupled to the board. These other components can include, but are not limited to, memory 1104, such as volatile memory (e.g., DRAM), non-volatile memory (e.g., ROM), or flash memory, an antenna 1122, a display device 1106, a battery/power 1114, an audio output device 1108, an audio input device 1118, a global positioning system (GPS) device 1116, another output device 1110 (such as video output), and other input device 1120 (such as video input), a security interface device 1121, and/or a test device. In one embodiment, a heat regulation/refrigeration device 1111 is included and is coupled to the board, e.g., a device including actively cooled copper channels.

The communication chip 1112 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1112 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1112. For instance, a first communication chip 1112 may be dedicated to shorter range wireless communications such as Wi-Fi and Bluetooth and a second communication chip 1112 may be dedicated to longer range wireless communications such as GPS, EDGE, GPRS, CDMA, WiMAX, LTE, Ev-DO, and others.

The processing device 1102 of the computing device 1100 can include an integrated circuit die in a package. The processing device 1102 may include one or more structures, such as gate-all-around integrated circuit structures having backside high voltage capacitors for front side GaN-based devices, built in accordance with implementations of embodiments of the present disclosure. The term "processing device" may refer to any device or portion of a device that processes electronic data from registers and/or memory to transform that electronic data into other electronic data that may be stored in registers and/or memory.

Figure 11B:
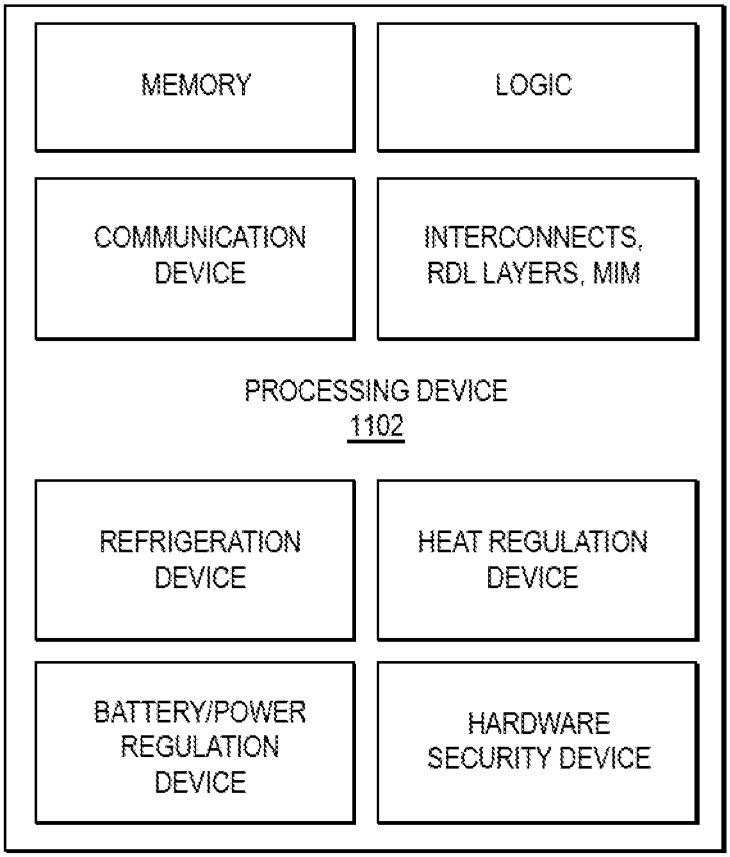
FIG. 11B illustrates a processing device in accordance with one implementation of an embodiment of the present disclosure.

FIG. 11B illustrates a processing device in accordance with one implementation of an embodiment of the present disclosure. Referring to FIG. 11B, an exemplary processing device 1102 includes a memory region, a logic region, a communication device region, an interconnects and redistribution layer (RDL) and metal-insulator-metal (MIM) region, a refrigeration device region, a heat regulation device region, a batter/power regulation device region and a hardware security device region. In one embodiment, the refrigeration device region and/or the heat regulation device region is a region including actively cooled copper channels.

Figure 12:
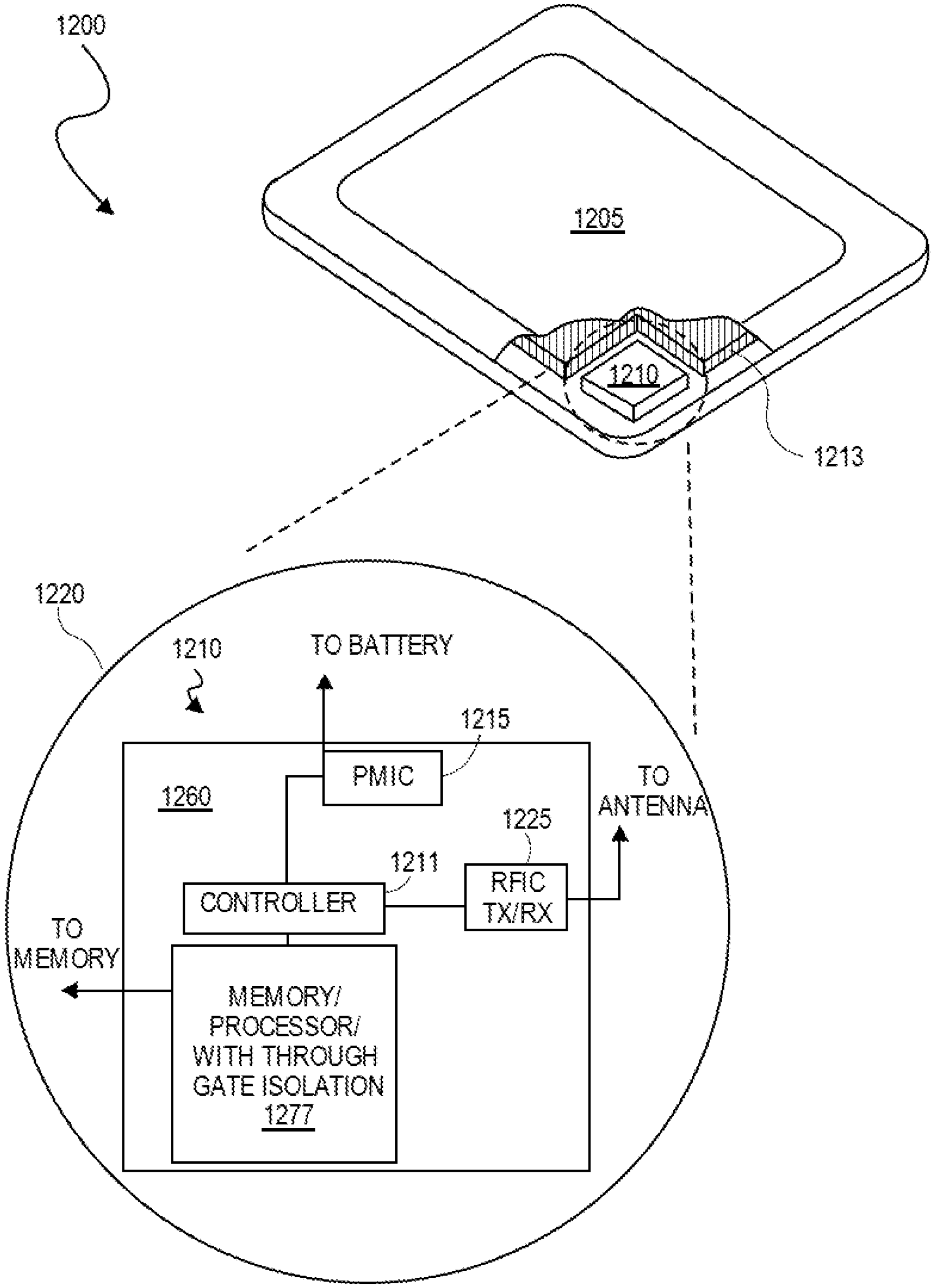
FIG. 12 is an isometric view of a mobile computing platform employing an IC fabricated according to one or more processes described herein or including one or more features described herein, in accordance with an embodiment of the present disclosure.

FIG. 12 is an isometric view of a mobile computing platform 1200 employing an integrated circuit (IC) fabricated according to one or more processes described herein or including one or more features described herein, in accordance with an embodiment of the present disclosure.

The mobile computing platform 1200 may be any portable device configured for each of electronic data display, electronic data processing, and wireless electronic data transmission. For example, mobile computing platform 1200 may be any of a tablet, a smart phone, laptop computer, etc. and includes a display screen 1205 which in the exemplary embodiment is a touchscreen (capacitive, inductive, resistive, etc.), a chip-level (SoC) or package-level integrated system 1210, and a battery 1213. As illustrated, the greater the level of integration in the system 1210 enabled by higher transistor packing density, the greater the portion of the mobile computing platform 1200 that may be occupied by the battery 1213 or non-volatile storage, such as a solid state drive, or the greater the transistor gate count for improved platform functionality. Similarly, the greater the carrier mobility of each transistor in the system 1210, the greater the functionality. As such, techniques described herein may enable performance and form factor improvements in the mobile computing platform 1200.

The integrated system 1210 is further illustrated in the expanded view 1220. In the exemplary embodiment, packaged device 1277 includes at least one memory chip (e.g., RAM), or at least one processor chip (e.g., a multi-core microprocessor and/or graphics processor) fabricated according to one or more processes described herein or including one or more features described herein. The packaged device 1277 is further coupled to the board 1260 along with one or more of a power management integrated circuit (PMIC) 1215, RF (wireless) integrated circuit (RFIC) 1225 including a wideband RF (wireless) transmitter and/or receiver (e.g., including a digital baseband and an analog front end module further includes a power amplifier on a transmit path and a low noise amplifier on a receive path), and a controller thereof 1211. Functionally, the PMIC 1215 performs battery power regulation, DC-to-DC conversion, etc., and so has an input coupled to the battery 1213 and with an output providing a current supply to all the other functional modules. As further illustrated, in the exemplary embodiment, the RFIC 1225 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1277 or within a single IC (SoC) coupled to the package substrate of the packaged device 1277.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include integrated circuit structures having backside high voltage capacitors for front side GaN-based devices, and methods of fabricating integrated circuit structures having backside high voltage capacitors for front side GaN-based devices.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a front side structure including a GaN-based device layer, and one or more metallization layers above the GaN-based device layer. A backside structure is below and coupled to the GaN-based layer, the backside structure including metal layers and one or more metal insulator metal capacitors.

Example embodiment 2: The integrated circuit structure of example embodiment 1, wherein the GaN-based device layer is on a silicon layer of the front side structure.

Example embodiment 3: The integrated circuit structure of example embodiment 1 or 2, wherein the backside structure is coupled to the GaN-based layer by one or more through-silicon vias.

Example embodiment 4: The integrated circuit structure of example embodiment 1, 2 or 3, wherein the front side structure includes one or more metal insulator metal capacitors above the GaN-based device layer.

Example embodiment 5: An integrated circuit structure includes a front side structure including a GaN-based device layer, one or more silicon-based transistors, and one or more metallization layers above the GaN-based device layer and the one or more silicon-based transistors. A backside structure is below and coupled to the GaN-based layer and the one or more silicon-based transistors, the backside structure including metal layers and one or more metal insulator metal capacitors.

Example embodiment 6: The integrated circuit structure of example embodiment 5, wherein the one or more silicon-based transistors are one or more fin-based transistors.

Example embodiment 7: The integrated circuit structure of example embodiment 5, wherein the one or more silicon-based transistors are one or more nano-wire-based transistors.

Example embodiment 8: The integrated circuit structure of example embodiment 5, 6 or 7, wherein the GaN-based device layer is on a silicon layer of the front side structure.

Example embodiment 9: The integrated circuit structure of example embodiment 5, 6, 7 or 8, wherein the backside structure is coupled to the GaN-based layer by one or more through-silicon vias.

Example embodiment 10: The integrated circuit structure of example embodiment 5, 6, 7, 8 or 9, wherein the front side structure includes one or more metal insulator metal capacitors above the GaN-based device layer and the one or more silicon-based transistors.

Example embodiment 11: A computing device includes a board, and a component coupled to the board. The component includes an integrated circuit structure including a front side structure including a front side structure including a GaN-based device layer, and one or more metallization layers above the GaN-based device layer. A backside structure is below and coupled to the GaN-based layer, the backside structure including metal layers and one or more metal insulator metal capacitors.

Example embodiment 12: The computing device of example embodiment 11, further including a memory coupled to the board.

Example embodiment 13: The computing device of example embodiment 11 or 12, further including a communication chip coupled to the board.

Example embodiment 14: The computing device of example embodiment 11, 12 or 13, wherein the component is a packaged integrated circuit die.

Example embodiment 15: The computing device of example embodiment 11, 12, 13 or 14, wherein the component is selected from the group consisting of a processor, a communications chip, and a digital signal processor.

Example embodiment 16: A computing device includes a board, and a component coupled to the board. The component includes an integrated circuit structure including a front side structure including a GaN-based device layer, one or more silicon-based transistors, and one or more metallization layers above the GaN-based device layer and the one or more silicon-based transistors. A backside structure is below and coupled to the GaN-based layer and the one or more silicon-based transistors, the backside structure including metal layers and one or more metal insulator metal capacitors.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, wherein the component is a packaged integrated circuit die.

Example embodiment 20: The computing device of example embodiment 16, 17, 18 or 19, wherein the component is selected from the group consisting of a processor, a communications chip, and a digital signal processor.

What is claimed is:

1. An integrated circuit structure, comprising:
a front side structure comprising:
a GaN-based device layer; and
one or more metallization layers above the GaN-based device layer;
a backside structure below and coupled to the GaN-based layer, the backside structure including metal layers and one or more alternating laterally-recessed metal insulator metal capacitors.

2. The integrated circuit structure of claim 1, wherein the GaN-based device layer is on a silicon layer of the front side structure.

3. The integrated circuit structure of claim 2, wherein the backside structure is coupled to the GaN-based layer by one or more through-silicon vias.

4. The integrated circuit structure of claim 1, wherein the front side structure includes one or more metal insulator metal capacitors above the GaN-based device layer.

5. An integrated circuit structure, comprising:
a front side structure comprising:
a GaN-based device layer;
one or more silicon-based transistors;
one or more metallization layers above the GaN-based device layer and the one or more silicon-based transistors;
a backside structure below and coupled to the GaN-based layer and the one or more silicon-based transistors, the backside structure including metal layers and one or more alternating laterally-recessed metal insulator metal capacitors.

6. The integrated circuit structure of claim 5, wherein the one or more silicon-based transistors are one or more fin-based transistors.

7. The integrated circuit structure of claim 5, wherein the one or more silicon-based transistors are one or more nano-wire-based transistors.

8. The integrated circuit structure of claim 5, wherein the GaN-based device layer is on a silicon layer of the front side structure.

9. The integrated circuit structure of claim 8, wherein the backside structure is coupled to the GaN-based layer by one or more through-silicon vias.

10. The integrated circuit structure of claim 5, wherein the front side structure includes one or more metal insulator metal capacitors above the GaN-based device layer and the one or more silicon-based transistors.

11. A computing device, comprising:
a board; and
a component coupled to the board, the component including an integrated circuit structure, comprising:
a front side structure comprising:
a GaN-based device layer; and
one or more metallization layers above the GaN-based device layer;
a backside structure below and coupled to the GaN-based layer, the backside structure including metal layers and one or more alternating laterally-recessed metal insulator metal capacitors.

12. The computing device of claim 11, further comprising:
a memory coupled to the board.

13. The computing device of claim 11, further comprising:
a communication chip coupled to the board.

14. The computing device of claim 11, wherein the component is a packaged integrated circuit die.

15. The computing device of claim 11, wherein the component is selected from the group consisting of a processor, a communications chip, and a digital signal processor.

16. A computing device, comprising:
a board; and
a component coupled to the board, the component including an integrated circuit structure, comprising:
a front side structure comprising:
a GaN-based device layer;
one or more silicon-based transistors;
one or more metallization layers above the GaN-based device layer and the one or more silicon-based transistors;
a backside structure below and coupled to the GaN-based layer and the one or more silicon-based transistors, the backside structure including metal layers and one or more alternating laterally-recessed metal insulator metal capacitors.

17. The computing device of claim 16, further comprising:

a memory coupled to the board.

18. The computing device of claim 16, further comprising:

a communication chip coupled to the board.

19. The computing device of claim 16, wherein the component is a packaged integrated circuit die.

20. The computing device of claim 16, wherein the component is selected from the group consisting of a processor, a communications chip, and a digital signal processor.

* * * * *